(12) United States Patent
Bocock et al.

(10) Patent No.: US 7,710,199 B2
(45) Date of Patent: May 4, 2010

(54) METHOD AND APPARATUS FOR STABILIZING RF POWER AMPLIFIERS

(75) Inventors: Ryan M. Bocock, Austin, TX (US);
David Bockelman, Austin, TX (US);
Susanne A. Paul, Austin, TX (US);
Timothy J. Dupuis, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 8 days.

(21) Appl. No.: 11/536,820

(22) Filed: Sep. 29, 2006

(65) Prior Publication Data

US 2007/0139112 A1 Jun. 21, 2007

Related U.S. Application Data

(63) Continuation-in-part of application No. 10/812,858, filed on Mar. 30, 2004, now abandoned, which is a continuation of application No. 10/390,935, filed on Mar. 18, 2003, now Pat. No. 6,788,141, which is a continuation of application No. 09/660,123, filed on Sep. 12, 2000, now Pat. No. 6,549,071.

(51) Int. Cl.
*H03F 3/45* (2006.01)

(52) U.S. Cl. .................. 330/258; 330/260; 330/311; 330/263; 330/271

(58) Field of Classification Search .............. 330/258, 330/253, 252, 260, 311, 263, 262, 271
See application file for complete search history.

(56) References Cited

U.S. PATENT DOCUMENTS

| | | | | |
|---|---|---|---|---|
| 4,871,978 A | * | 10/1989 | Galbraith | 330/253 |
| 4,910,801 A | | 3/1990 | Anzini et al. | |
| 5,113,147 A | * | 5/1992 | Klein | 330/253 |
| 5,381,112 A | * | 1/1995 | Rybicki et al. | 330/253 |
| 5,874,840 A | * | 2/1999 | Bonaccio | 327/55 |
| 5,936,466 A | * | 8/1999 | Andoh et al. | 330/253 |
| 6,094,099 A | | 7/2000 | Kobayashi | |
| 6,198,352 B1 | * | 3/2001 | Tanji | 330/302 |
| 6,424,181 B1 | * | 7/2002 | Pogrebnoy | 327/55 |
| 6,987,425 B1 | * | 1/2006 | Sutardja | 331/117 R |

* cited by examiner

*Primary Examiner*—Michael B Shingleton
(74) *Attorney, Agent, or Firm*—Johnson & Associates

(57) ABSTRACT

A method and apparatus is provided for use in power amplifiers for reducing the peak voltage that transistors are subjected to. A power amplifier is provided with first and second switching devices and an inductor connected between the switching devices. The switching devices are driven such that the switching devices are turned on and off during the same time intervals. Differential RF power amplifiers are also provided with inductive networks coupled at various nodes of the power amplifiers. In some examples, techniques are used to stabilize differential power amplifiers by stabilizing common-mode feedback loops.

20 Claims, 26 Drawing Sheets

METHOD AND APPARATUS FOR STABILIZING RF POWER AMPLIFIERS

CROSS-REFERENCE TO RELATED APPLICATIONS

This application is a continuation-in-part of commonly owned U.S. patent application Ser. No. 10/812,858 filed on Mar. 30, 2004 now abandoned, entitled "Power Amplifier Circuitry And Method", which is a continuation of commonly owned U.S. patent application Ser. No. 10/390,935 filed on Mar. 18, 2003 (U.S. Pat. No. 6,788,141), entitled "Power Amplifier Circuitry And Method", which is a continuation of U.S. patent application Ser. No. 09/660,123 filed on Sep. 12, 2000 (U.S. Pat. No. 6,549,071), entitled "Power Amplifier Circuitry And Method".

FIELD OF THE INVENTION

This invention relates to the field of power amplifiers. More particularly, this invention relates to techniques for stabilizing power amplifiers.

BACKGROUND OF THE INVENTION

In some applications utilizing a power amplifier, it is desirable to limit the peak voltage that the switching devices of the power amplifier are subjected to. For example, in CMOS devices, the transistor breakdown voltage may be only slightly greater than the supply voltage. Therefore, CMOS devices are not well suited to traditional power amplifier designs, where switching devices are subjected to voltages at least twice the supply voltage.

FIG. 1 is a schematic diagram of a conventional Class E amplifier. As shown, a transistor M1 is connected between ground and an inductor L1 which is connected to a voltage source $V_{dd}$. The gate of the transistor M1 is connected to an input signal Vi. The connection of the transistor M1 and the inductor L1 forms a node labeled Vd. The switching device M1, as well as other switching devices described may be comprised of any suitable switching devices, for example, MOSFETs or other transistor types. A capacitor C1 is connected between Vd and ground. The amplifier includes a transformation network consisting of inductor L2 and capacitor C2. The capacitor C2 is connected to a load $R_L$ at output node $V_o$.

FIG. 2 is a timing diagram illustrating the input signal Vi and the resulting voltage at Vd. As shown, the input signal Vi is a square wave signal switching between ground and $V_{dd}$. When the input signal Vi is high ($V_{dd}$), the transistor M1 is turned on, holding Vd to ground. When the input signal Vi transitions to low, transistor M1 turns off and the voltage at Vd rises above $V_{dd}$. During this time, the transistor M1 must sustain this high drain-to-source voltage. After peaking, the voltage at Vd decreases until it reaches ground. In a typical prior art Class E design, this peak voltage is approximately $3.6 V_{dd}$. Although the peak voltage can be reduced slightly, it can not be decreased below about $2.5 V_{dd}$ since the average voltage at Vd must equal $V_{dd}$. Designs such as that shown in FIG. 1 are not well suited to certain device technologies, such as CMOS, where transistor breakdown voltages are only slightly higher than the supply voltage.

It can therefore be seen that there is a need for amplifier designs where the peak voltages applied to the transistors of the amplifier are reduced so that they are below the transistor breakdown voltages of the devices being used to implement the design.

Another problem relating to amplifiers relates to the use of differential circuits. It is difficult to perform differential-to-single-ended conversion when a single ended load is required with high efficiency. Therefore, there is a need for improved differential-to-single-ended conversion designs.

Another problem with differential RF power amplifiers relates to stabilization of both the differential and common modes. Typically, all power amplifier modes are required to be stable over a specified set of loads and operating conditions. There is a need for techniques which stabilize power amplifiers over these conditions without compromising efficiency.

SUMMARY OF THE INVENTION

Differential RF power amplifiers use one or more techniques for stabilizing the power amplifiers. In one example, a differential power amplifier includes first and second amplifiers that are configured to be coupled differentially to a load. To help stabilize the RF power amplifier, a network is coupled to the first and second amplifiers to provide attenuation to signals in a first mode of operation while providing less attenuation to signals in a second mode of operation. In one example, the first amplifier is comprised of first and second switching devices coupled between a voltage differential. A second amplifier is comprised of third and fourth switching devices coupled between a voltage differential.

In another example, a differential RF power amplifier includes a first amplifier having first and second switching devices coupled between a voltage differential, and a second amplifier having third and fourth switching devices coupled between a voltage differential. A first resistance is coupled between an input of the first switching device and an input of the fourth switching device. A second resistance coupled between an input of the second switching device and an input of the third switching device.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following illustrates a typical application of the present invention. A power amplifier of the present invention may be used as an amplifier for use with a wireless transmission system such as a wireless telephone or other device. The invention may also be applied to other applications, including, but not limited to, RF power amplifiers. In a wireless device such as a cellular telephone, the device may include a transceiver, an antenna duplexer, and an antenna. Connected between the transceiver and the antenna duplexer is an RF power amplifier for amplifying signals for transmission via the antenna. This is one example of an application of a power amplifier of the present invention. Of course the invention may be used in any other application requiring a power amplifier. In the case of a wireless telephone application, the invention may be applied to GSM or other constant envelope modulation systems.

Figure 1:
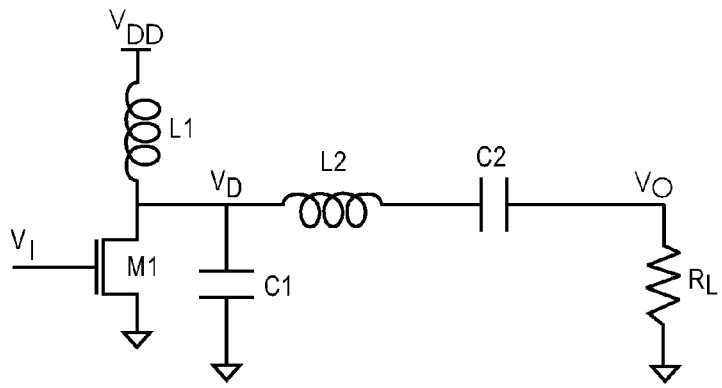
FIG. 1 is a schematic diagram of a prior art Class E amplifier.
Figure 2:
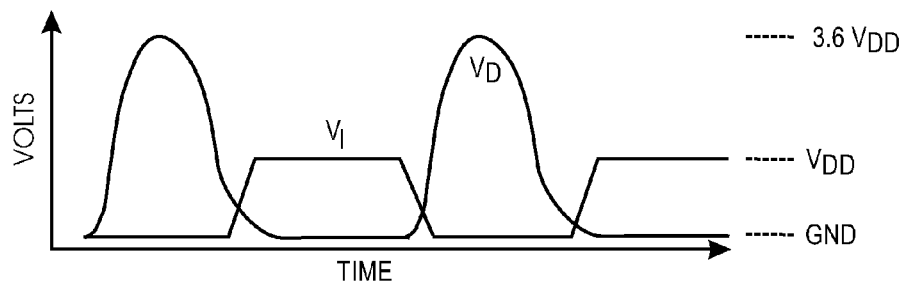
FIG. 2 is a timing diagram illustrating the voltage at $V_D$ relative to the input signal $V_I$ for the prior art Class E amplifier shown in FIG. 1.
Figure 3:
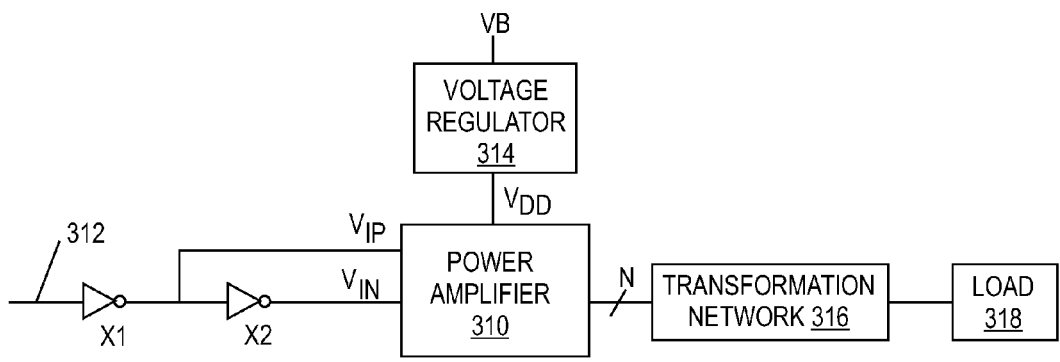
FIG. 3 is a block diagram illustrating an example of an environment in which a power amplifier of the present invention may be used.

FIG. 3 is a block diagram illustrating an example of an environment in which a power amplifier of the present invention may be used. FIG. 3 shows a power amplifier 310 connected to a pair of input signals $V_{in}$ and $V_{ip}$. The input signals come from an input 312 from an input network such as the transceiver chip mentioned above. An input buffer is formed by a plurality of inverters X1 and X2 which are connected to the input 312 as shown. The input buffer circuit could also be comprised of more or less inverters, or any other suitable circuitry. The power amplifier 310 is also connected to a voltage regulator 314 which provides a regulated voltage source $V_{dd}$ from a voltage source, such as battery voltage VB. The power amplifier 310 is also connected to a transformation network 316 which is connected to a load 318. Note that the connection between power amplifier 310 and the transformation network 316 may be comprised of a single or multiple connections. FIG. 3 is shown with n connections. In the example of a wireless transmission system, the load 318 may be comprised of an antenna. Note that the components shown in FIG. 3 are optional and are not essential to the power amplifier 310.

Figure 4:
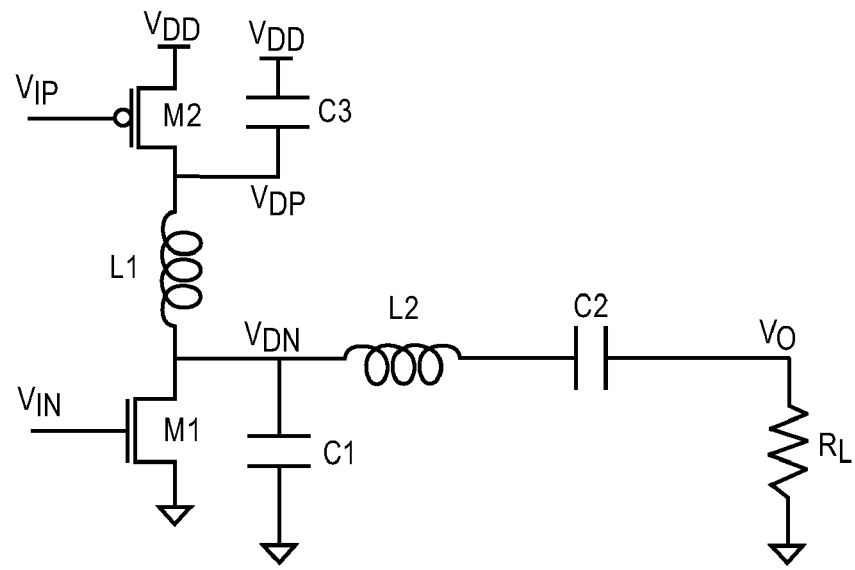
FIG. 4 is a schematic diagram of one embodiment of a power amplifier of the present invention.

FIG. 4 is a schematic diagram of one embodiment of a power amplifier of the present invention. The power amplifier includes a switching device M1 connected between ground and the node labeled $V_{dn}$. The gate of the switching device M1 is connected to the input signal $V_{in}$. Another switching device M2 is connected between the voltage source $V_{dd}$ and a node labeled $V_{dp}$. The gate of the switching device M2 is connected to the input signal $V_{ip}$. Connected between the switching devices M2 and M1 is an inductor L1. FIG. 4 also shows a capacitor C1 connected between $V_{dn}$ and ground. A capacitor C3 is connected between $V_{dp}$ and Vdd. The capacitors C1 and C3 may be comprised of a combination of separate capacitors and parasitic capacitances of the switching devices M1 and M2. The power amplifier shown in FIG. 4 also includes a reactive network connected between $V_{dn}$ and the amplifier output $V_o$. The reactive network is formed by inductor L2 and capacitor C2 and can be used for filtering or impedance transformation. A load $R_L$ is connected to the amplifier output $V_o$.

Figure 5:
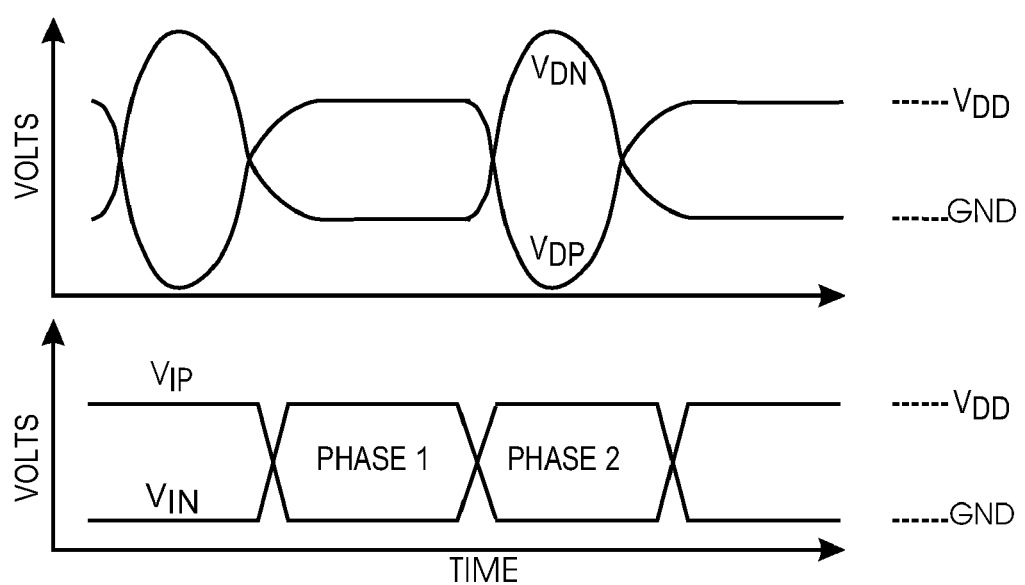
FIG. 5 is a timing diagram illustrating the voltages present in the amplifier shown in FIG. 4, relative to the input signals.

The power amplifier shown in FIG. 4 resembles a push-pull amplifier topologically, but is fundamentally different, in that the input signals $V_{in}$ and $V_{ip}$ are inverses of one another. Since switching device M1 is an n-channel device and switching device M2 is a p-channel device, the switching devices M1 and M2 are both turned on and turned off during the same time intervals. FIG. 5 is a timing diagram illustrating the voltages present in the amplifier shown in FIG. 4, relative to the input signals. FIG. 5 shows the input signals $V_{in}$ and $V_{ip}$ which are 180° out of phase with each other. In other words, when one of the input signals is high, the other is low. During phase 1 ($V_{in}$ high and $V_{ip}$ low), the switching devices M1 and M2 are both turned on so that $V_{dp}$ and $V_{dn}$ are clamped to $V_{dd}$ and ground respectively. During phase 2 ($V_{in}$ low and $V_{ip}$ high), the switching devices M1 and M2 are both turned off. The voltage at $V_{dn}$ rises and begins to ring at a frequency determined by the values of the components L1, C1, C3, L2, and C2. For the best efficiency, these components are chosen so that $V_{dn}$ rises and then returns to ground immediately before the end of phase 2. The voltage at $V_{dp}$ falls and rings in a similar way. The voltage at node $V_{dp}$ rises back to $V_{dd}$ immediately before the end of phase 2, when switching devices M1 and M2 are turned on.

The peak voltages present across the switching devices M1 and M2 can be adjusted as desired by changing the passive component values in the circuit under the constraint that the average voltage of $V_{dn}$ must equal that of $V_{dp}$. If this average voltage lies at $V_{dd}/2$ then the peak value of $V_{dn}$ will be only slightly higher than $V_{dd}$ and that of $V_{dp}$ will be only slightly lower than ground. The duty cycle of the input signals $V_{in}$ and $V_{ip}$ waveforms can be adjusted to reduce the peak voltages even further. As a result, this configuration eliminates the large signal swings that transistors are subjected to in the prior art.

Figure 6:
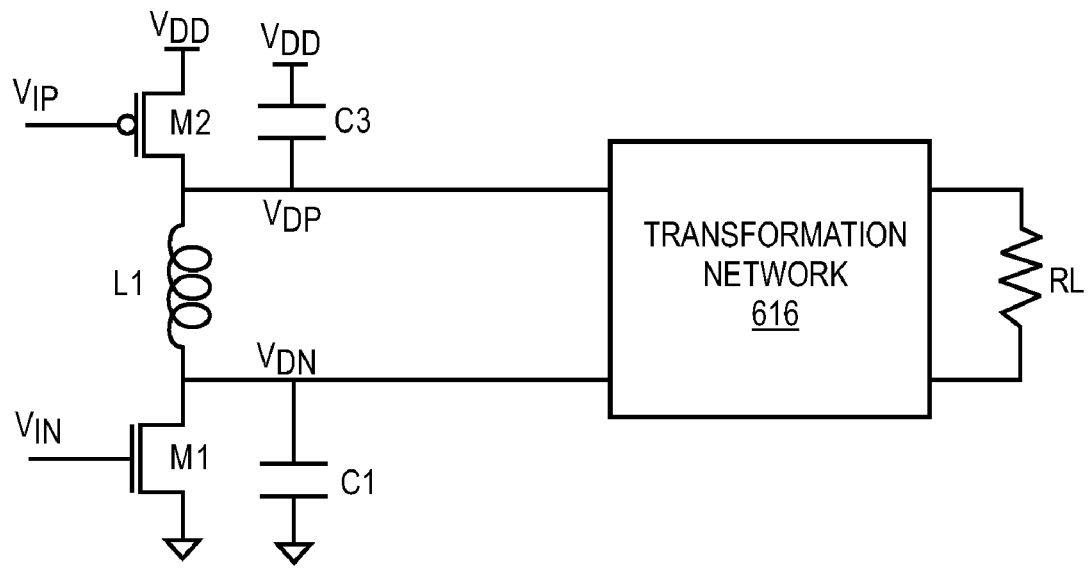
FIG. 6 is a schematic diagram of an embodiment of a power amplifier of the present invention with a load connected differentially.

The power amplifier shown in FIG. 4 does not take full advantage of the signal swing that occurs on node $V_{dp}$. An increase in efficiency can be achieved by making use of the signal swing on both $V_{dp}$ and $V_{dn}$. This can be accomplished by connecting the load differentially across nodes $V_{dp}$ and $V_{dn}$ as shown in FIG. 6. FIG. 6 shows a power amplifier similar to that shown in FIG. 4. The power amplifier includes switching devices M1 and M2, inductor L1, and capacitors C1 and C3. A transformation network 616 is connected to both nodes $V_{dp}$ and $V_{dn}$. A load $R_L$ is connected to the transformation network 616. The waveforms for the power amplifier shown in FIG. 6 are similar to those for the power amplifier shown in FIG. 4. In this embodiment, the current flowing through the load $R_L$ is determined by the difference between the voltages on $V_{dp}$ and $V_{dn}$.

Figure 7:
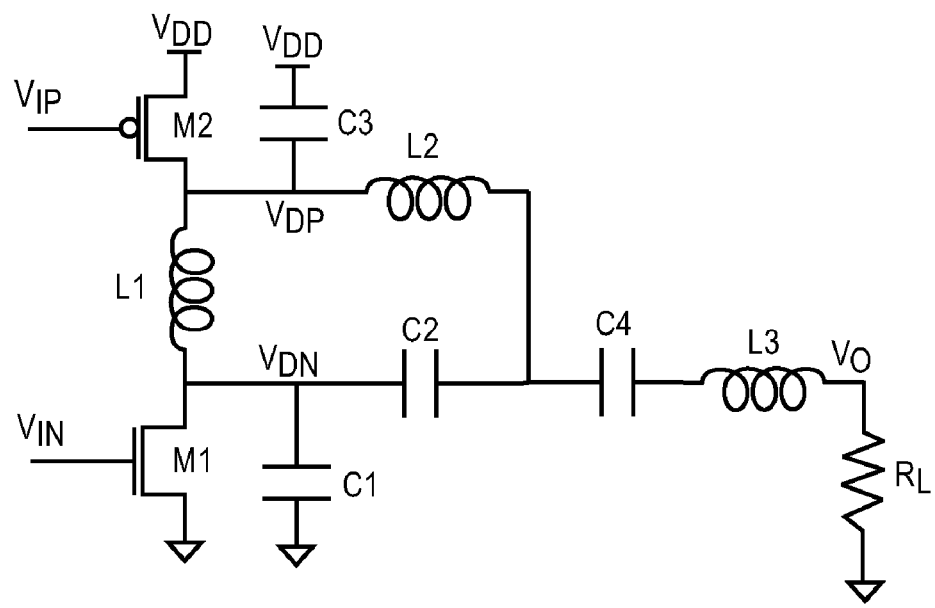
FIG. 7 is a schematic diagram of an embodiment of a power amplifier of the present invention connected to a single-ended load.

When a single-ended load is required, the transformation network can be made to facilitate a single-ended load. FIG. 7 shows a power amplifier with two capacitors C2 and C4 and an inductor L3 connected as shown between $V_{dn}$ and $V_o$. An inductor L2 is connected between $V_{dp}$ and the connection point of the capacitors C2 and C4. A single-ended load $R_L$ is connected between $V_o$ and ground. The waveforms for the power amplifier shown in FIG. 7 are similar to those for the power amplifier shown in FIG. 4. In this embodiment, the current flowing to the output from $V_{dp}$ and current flowing to the output from $V_{dn}$ add when they are summed in phase at the load. The load is AC coupled from either $V_{dp}$ or $V_{dn}$ by capacitor C4. The inductor L2 and capacitor C2 can also be chosen to transform the load impedance $R_L$ into a desired impedance so that power delivered to the load can be adjusted independently from the voltage swing on Vdp and Vdn. In this case, the voltage swing on $V_o$ will vary from that on $V_{dp}$ and $V_{dn}$ as determined by the selection of C2 and L2. Since the combination of L2 and C2 is a tuned circuit, it provides some bandpass filtering. If additional filtering is desired, capacitor C4 and inductor L3 can also be used as an additional bandpass filter. In summary, L2 and C2 in the configuration of FIG. 7 simultaneously perform the functions of impedance transformation, filtering, and differential-to-single-ended conversion.

Figure 8:
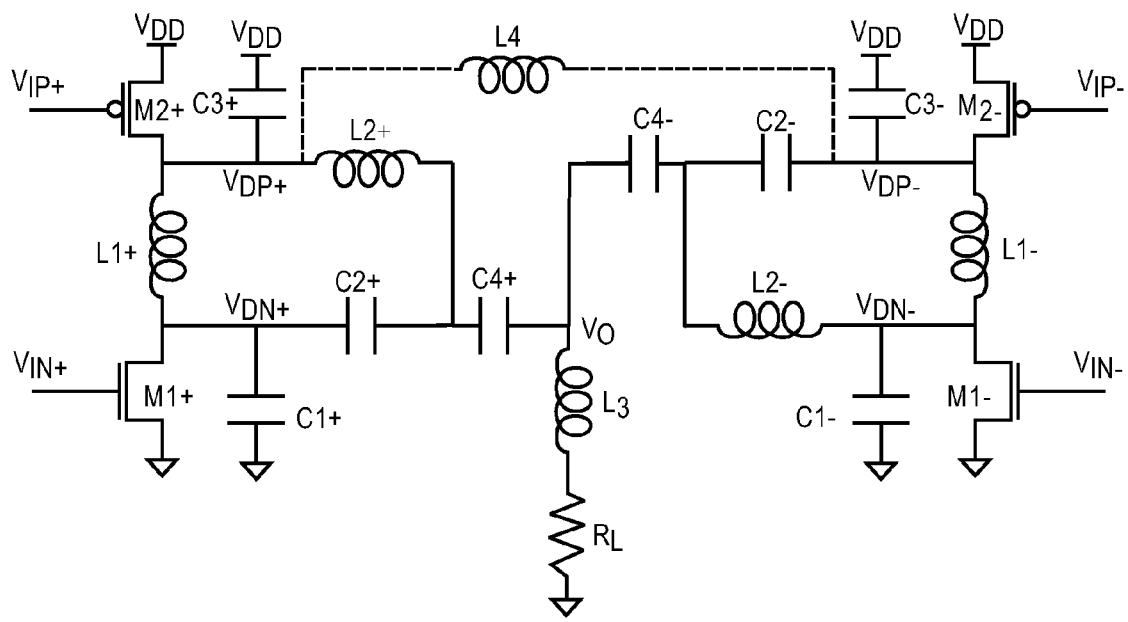
FIG. 8 is a schematic diagram of an embodiment of a power amplifier of the present invention connected differentially.
Figure 9:
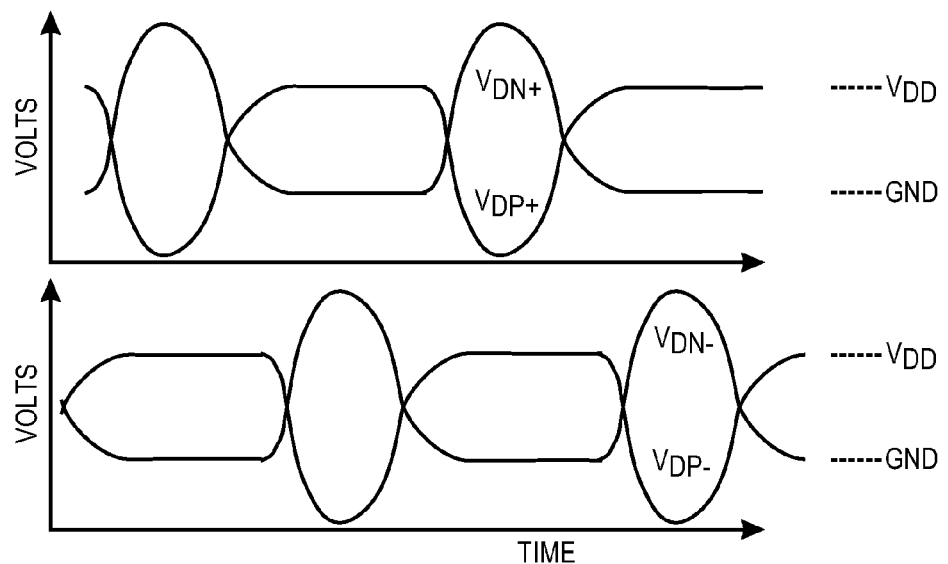
FIG. 9 is a timing diagram illustrating the voltages present in the amplifier shown in FIG. 8.

The amplifier of the present invention may also be implemented differentially using two amplifiers (such as the amplifier shown in FIG. 7) connected together as shown in FIG. 8. FIG. 8 shows a first amplifier (the positive side) comprised of switching devices M1+ and M2+, inductor L1+, capacitors C1+ and C3+, and a transformation network comprised of capacitors C2+ and C4+ and inductors L2+ and L3. A second amplifier (the negative side) is comprised of switching devices M1− and M2−, inductor L1−, capacitors C1− and C3−, and a transformation network comprised of capacitors C2− and C4− and inductors L2− and L3. The two amplifiers are similar to each other with the inductors L2 and capacitors C2 interchanged as shown. The input signals $V_{in−}$ and $V_{ip−}$ on the negative side are shifted by 180 degrees from the input signals $V_{in+}$ and $V_{ip+}$ on the positive side. FIG. 9 is a timing diagram illustrating the voltages present at the nodes $V_{dn+}$, $V_{dp+}$, $V_{dn−}$, and $V_{dp−}$.

The values of the passive components in the amplifier shown in FIG. 8 may be chosen so that the resulting currents from both amplifiers sum in phase at the load $R_L$. The advantages of the power amplifier shown in FIG. 8 are similar to the advantages common to differential circuits in general. For example, undesired interference from supply or substrate noise is common-mode. Another advantage is that the impact of supply resistance is reduced because the supply current flows during both clock phases.

Note that the load $R_L$ shown in FIG. 8 could be connected to only two of the four output nodes of the power amplifier. For example, a configuration similar to that shown in FIG. 4 could be connected differentially to the load $R_L$, where the nodes $V_{dp+}$ and $V_{dp−}$ are not connected to $V_o$.

FIG. 8 also shows an alternate embodiment where an optional inductor L4 is connected (shown in dashed lines) between nodes $V_{dp+}$ and $V_{dp−}$. Without the optional inductor L4, the voltage swings on nodes Vdp+, Vdp−, Vdn+ and Vdn− and the values of capacitors C1+, C1−, C3+ and C3− can not be independently adjusted. The optional inductor L4 has the advantage that these voltage swings can be adjusted independently of the capacitance values mentioned above.

The capacitors C1 and C3 described above are used to shape the waveforms of the voltages on $V_{dp}$ and $V_{dn}$. As mentioned above, these capacitances may be provided by separate capacitors or by the parasitic capacitances of switching devices M1 and M2. In another embodiment, these capacitances are formed by switching devices in a way that improves the efficiency of the amplifier.

Figure 10:
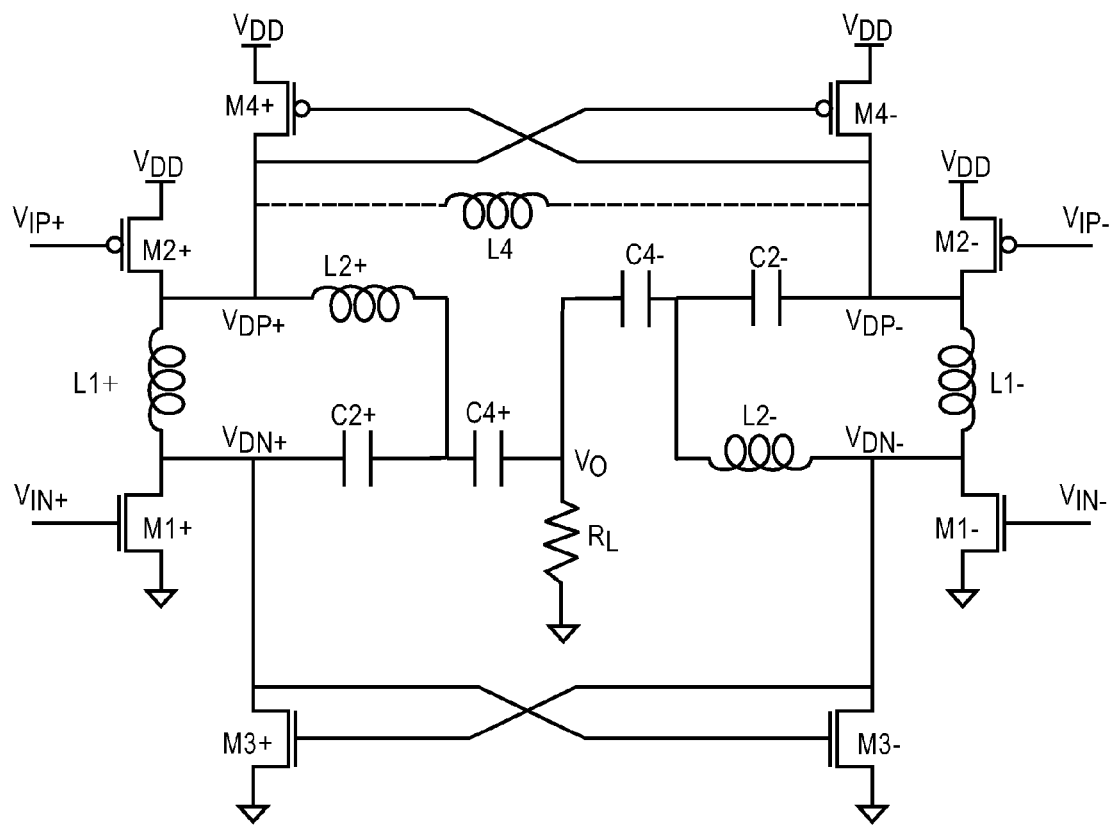
FIG. 10 is a schematic diagram of an embodiment of a power amplifier of the present invention.

FIG. 10 is a schematic diagram of a power amplifier similar to the amplifier shown in FIG. 8. In the amplifier shown in FIG. 10, the capacitors C1+ and C3+ are replaced by switching devices M3− and M4−, respectively. Similarly, the capacitors C1− and C3− are replaced by switching devices M3+ and M4+, respectively. Each of the switching devices M3 and M4 are driven as shown by a voltage from the opposite amplifier. For example, the switching device M4+ is driven by the voltage at $V_{dp-}$ on the negative side. The switching device M4− is driven by the voltage at $V_{dp+}$ on the positive side. Similarly, the switching device M3+ is driven by the voltage at $V_{dn-}$ while the switching device M3− is driven by the voltage at $V_{dn+}$. The waveforms for the amplifier shown in FIG. 10 are similar to those described above.

The amplifier shown in FIG. 10 allows the switching devices M1+ and M1− to be made smaller by an amount equal to the size of switching devices M3+ and M3−. Similarly, the switching devices M2+ and M2− can be made smaller by an amount equal to the size of switching devices M4+ and M4−. However, switching devices M1 and M2 should remain sufficiently large to assure stability of the circuit. A decrease in the size of the switching devices M1 and M2 improves the efficiency since the input capacitances that must be driven are smaller. Another advantage to the amplifier shown in FIG. 10 is that cross-coupling helps to assure that the waveforms present at $V_{dp-}$ and $V_{dn-}$ have the correct phase relationship to the waveforms present at $V_{dp+}$ and $V_{dn+}$, despite possible timing variations on the positive inputs ($V_{ip+}$, $V_{in+}$) and on the negative inputs ($V_{ip-}$, $V_{in-}$).

FIG. 10 also shows an alternate embodiment where an optional inductor L4 is connected (shown in dashed lines) between nodes $V_{dp+}$ and $V_{dp-}$, similar to the inductor L4 shown in FIG. 8. If the optional inductor L4 is connected, the voltage swings of nodes Vdp+, Vdp−, Vdn+, and Vdn− can be chosen independently from the input capacitances of M4−, M4+, M3−, M3+.

Figure 11:
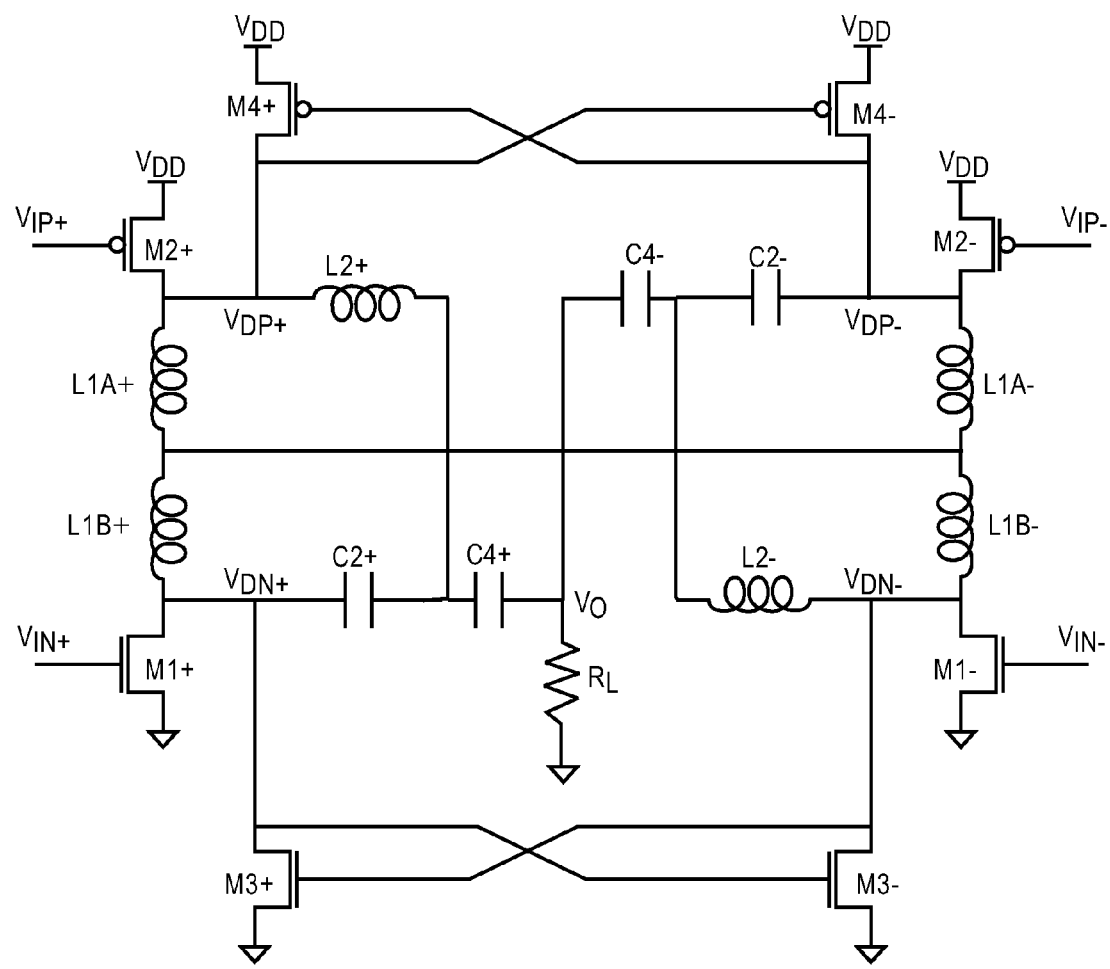
FIG. 11 is a schematic diagram of another embodiment of a power amplifier of the present invention.

FIG. 11 is a schematic diagram of a power amplifier similar to the amplifier shown in FIG. 10, but with the inductors L1+ and L1− replaced. Inductor L1+ is replaced with a pair of inductors L1A+ and L1B+. Inductor L1− is replaced with a pair of inductors L1A− and L1B−. The node formed by the connection of inductors L1A+ and L1B+ is connected to the node formed by the connection of inductors L1A− and L1B−. The embodiment shown in FIG. 11 has similar advantages to the embodiment in FIG. 10 with the optional inductor L4 in that it allows the voltage swings of nodes Vdp+, Vdp−, Vdn+, and Vdn− to be chosen independently from the input capacitances of M4−, M4+, M3−, M3+.

Figure 12:
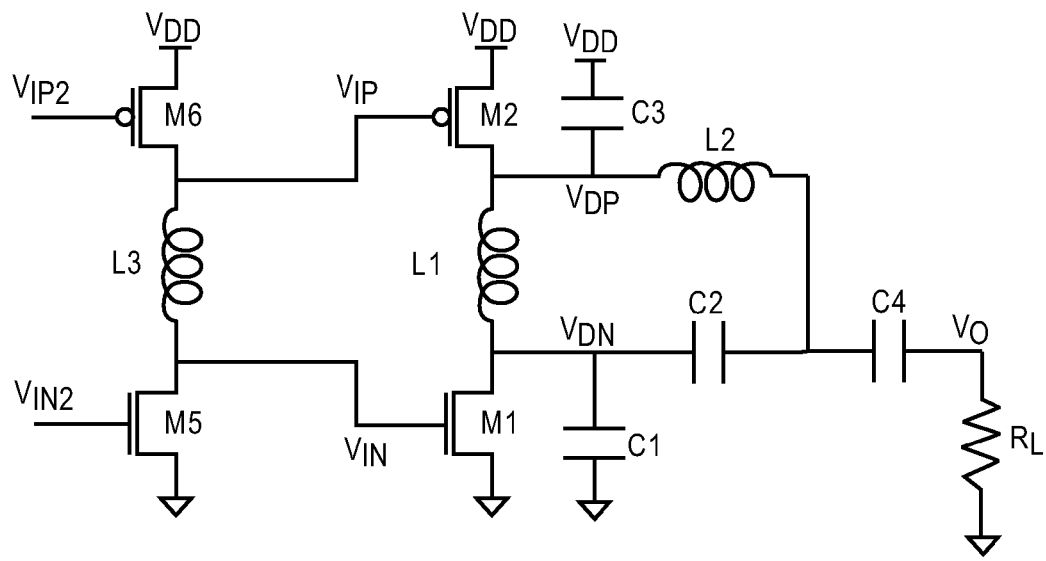
FIG. 12 is a schematic diagram of an embodiment of a power amplifier of the present invention having a preamplifier circuit.

As described above with respect to FIG. 3, input buffer circuitry may be used to drive the gates of the switching devices M1 and M2 of the amplifiers described above. However, the efficiency may be improved if a similar amplifier circuit is used as a preamplifier circuit. FIG. 12 is an example of an amplifier having a preamplifier circuit.

FIG. 12 shows an amplifier similar to the amplifier shown in FIG. 7. At the input of the amplifier, a preamplifier is shown. The preamplifier is comprised of switching devices M5 and M6 connected between ground and $V_{dd}$. An inductor L3 is connected between the switching devices M5 and M6. The preamplifier includes inputs $V_{ip2}$ and $V_{in2}$. The preamplifier circuit receives input signals $V_{ip2}$ and $V_{in2}$ and generates signals $V_{ip}$ and $V_{in}$ for use by the amplifier. The preamplifier circuit is similar to the amplifiers described above, except that all of the passive elements except inductor L3 are eliminated. The capacitances required by the preamplifier circuitry are formed from the input capacitances of the gates of switching devices M1 and M2. Of course, other passive elements could be used with the preamplifier circuit.

Figure 13:
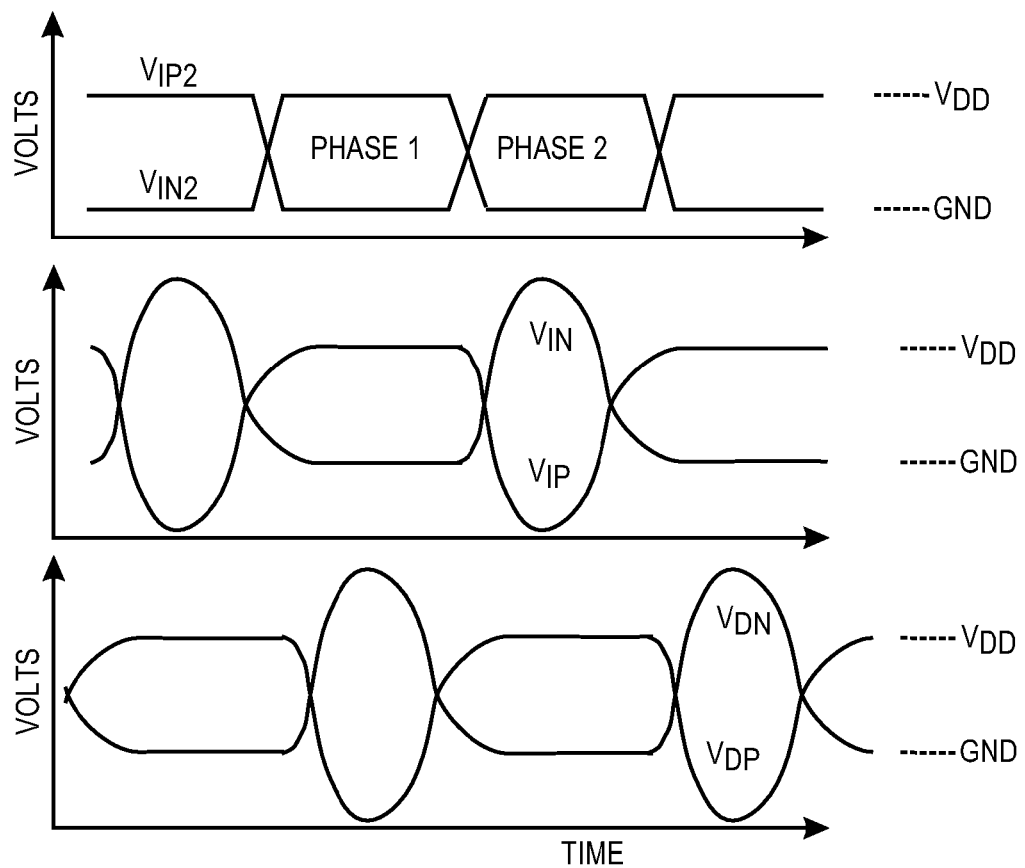
FIG. 13 is a timing diagram illustrating the voltages present in the amplifier shown in FIG. 12.

FIG. 13 is a timing diagram illustrating the waveforms at $V_{in}$, $V_{ip}$, $V_{dn}$, and $V_{dp}$ of FIG. 12. The preamplifier output waveforms $V_{ip}$ and $V_{in}$ have a shape that makes them well suited for driving the input gates of switching devices M1 and M2 in the final stage.

Note that in an alternate configuration the capacitor C4 could be connected between inductor L2 and $V_o$ with capacitor C2 connected between $V_{dn}$ and $V_o$. This alternate configuration functions similarly to the configuration shown in FIG. 12.

Figure 14:
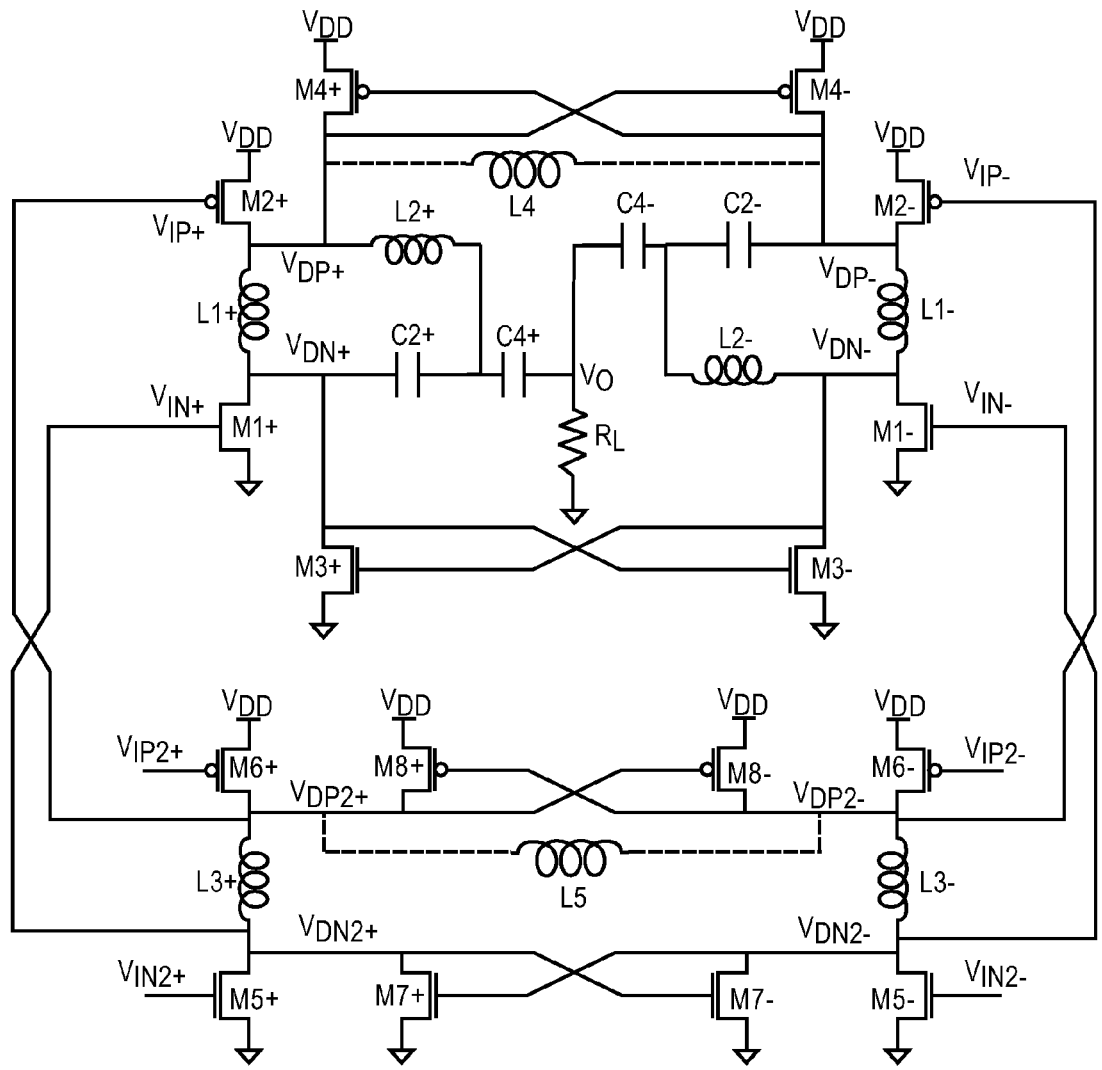
FIG. 14 is a schematic diagram of an embodiment of a two-stage differential power amplifier of the present invention.

FIG. 14 is a schematic diagram of an amplifier using a two-stage differential configuration which provides an increased efficiency over the circuit shown in FIG. 12. The amplifier shown in FIG. 14 is similar to the differential amplifier shown in FIG. 10, with the addition of preamplifier circuitry. The inputs $V_{ip+}$ and $V_{in+}$ of the amplifier are connected to preamplifier circuitry comprised of switching devices M5+ and M6+. The switching devices M5+ and M6+ are connected between ground and $V_{dd}$, with an inductor L3+ connected between them. Capacitances are provided to nodes $V_{dp2+}$ and $V_{dn2+}$ by switching devices M8+ and M7+, respectively. The negative side of the amplifier is configured in the same manner. The positive and negative sides of the preamplifier circuitry are cross-coupled in the same way as the amplifier circuitry shown in FIG. 10 (described above). In this configuration, the input capacitances of the NMOS and PMOS switching devices M1 and M2 of the power amplifier, the input capacitances of the preamplifier switching devices M7 and M8, and the value of inductor L5 can be adjusted so that the signals at $V_{dp2}$ and $V_{dn2}$ have the desired peak amplitudes.

Figure 31:
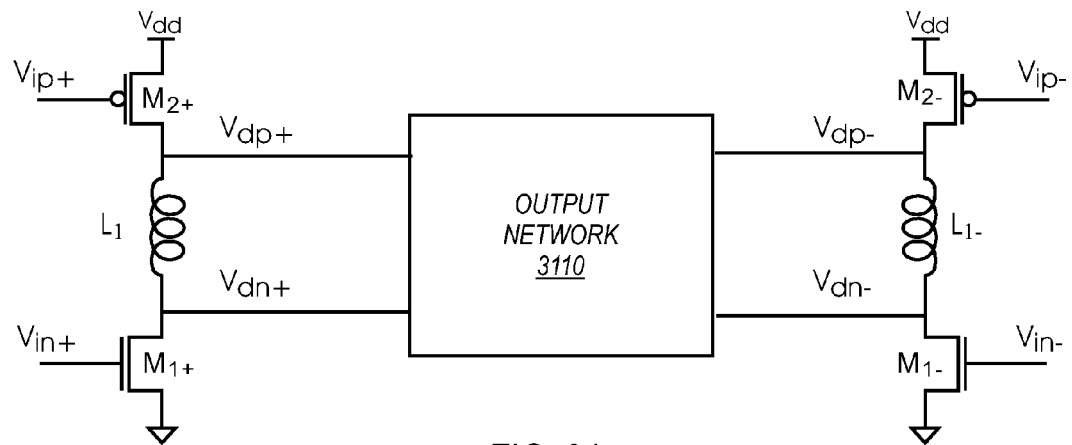
FIG. 31 is a diagram of a differential power amplifier.

The present invention also provides inductive networks for differential power amplifiers, such as the power amplifier shown in FIG. 31. FIG. 31 is a diagram of a differential power amplifier coupled to an output network 3110. The output network 3110 can include any desired circuitry, such as a transformation network. The output network 3110 can also include a load, or may be configured to drive a load. FIG. 31 shows a first amplifier (the positive side) comprised of switching devices M1+ and M2+, with inductor L1+ coupled between switching devices M1+ and M2+. A second amplifier (the negative side) is comprised of switching devices M1− and M2−, with inductor L1− coupled between switching devices M1− and M2−. The input signals Vin− and Vip− on the negative side are shifted by 180 degrees from the input signals Vin+ and Vip+ on the positive side. The differential power amplifier is coupled to the output network 3110 via nodes $V_{dn+}$, $V_{dp+}$, $V_{dn-}$, and $V_{dp-}$.

Figure 32:
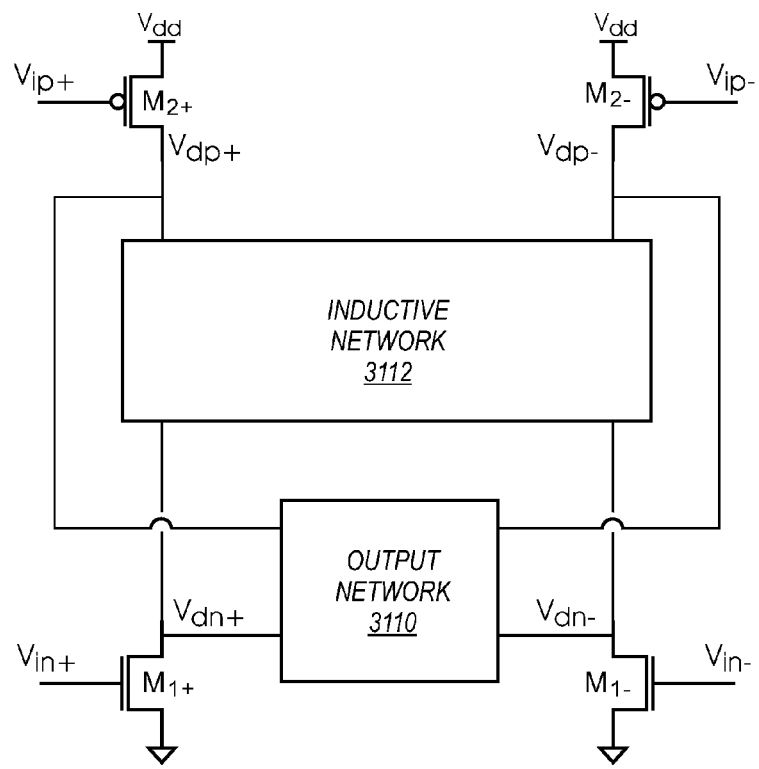
FIG. 32 is a diagram of a differential power amplifier, including an inductive network.

FIG. 32 is a diagram of a differential power amplifier similar to the differential power amplifier shown in FIG. 31. The differential power amplifier shown in FIG. 32 includes a first amplifier having switching devices M1+ and M2+. A second amplifier includes switching devices M1− and M2−. FIG. 32 also shows an output network 3110 and an inductive network 3112. The inductive network 3112 is shown coupled to the differential power amplifier at nodes $V_{dn+}$, $V_{dp+}$, $V_{dn-}$, and $V_{dp-}$. An inductive network may also be coupled to the differential power amplifier in other ways, if desired. Generally, the inductive network provides inductance between nodes $V_{dn+}$, $V_{dp+}$, $V_{dn-}$, and $V_{dp-}$ of the power amplifier. In one example, inductive networks can be configured such that the inductances between nodes $V_{dn+}$, $V_{dp+}$, $V_{dn-}$, and $V_{dp-}$ fall within the following values:

L from $V_{dp+}$ to $V_{dn+}$ >0

L from $V_{dp+}$ to $V_{dp-}$ >0

L from $V_{dp+}$ to $V_{dn-}$ ≧0

L from $V_{dn+}$ to $V_{dp-}$ ≧0

L from $V_{dn+}$ to $V_{dn-}$ >0

L from $V_{dp-}$ to $V_{dn-}$ >0.

In other words, those nodes that are out of phase have an inductance between them that is greater than 0 and those nodes that are in phase have an inductance between them that is greater than or equal to 0. In most cases, better efficiency will be achieved if the inductance between the nodes that are in phase is greater than 0. However, an inductance of 0 between the in-phase nodes has the advantage of simplicity since this topology requires fewer inductors. Of course, other embodiments are also possible. Also note that the inductances in the inductive network may be provided by inductors, or by the inductance from other components or conductive traces. For example, conductive traces in an integrated circuit or on a circuit board may have an inductance that depends on the layout of the circuit. Also, in some examples, components of the inductive network also form a part of the output network.

Described below are various examples of inductive networks. In addition, some of the figures described above also illustrate examples of inductive networks. For example, in FIG. 11, inductors L1A+, L1B+, L1A−, and L1B− illustrate an example of an inductive network. While the examples that follow describe inductive networks formed by various inductances, an inductive network may include other elements as well. For example, an inductive network may include capacitances. In such an example, the inductive network can also be thought of as a reactive network.

Figure 33:
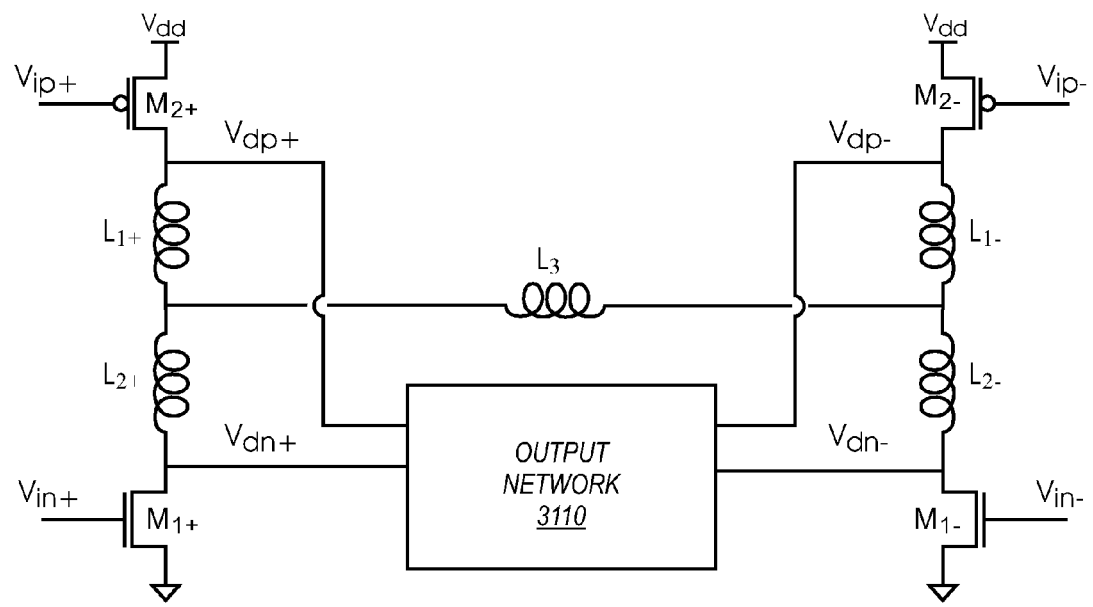
FIG. 33 is a diagram of a differential power amplifier, including one example of an inductive network.

FIG. 33 is a diagram of a differential power amplifier. The differential power amplifier shown in FIG. 33 includes a first amplifier having switching devices M1+ and M2+. A second amplifier includes switching devices M1− and M2−. An output network 3110 is coupled to nodes $V_{dn+}$, $V_{dp+}$, $V_{dn-}$, and $V_{dp-}$. An inductive network is also coupled to nodes $V_{dn+}$, $V_{dp+}$, $V_{dn-}$, and $V_{dp-}$. In this example, the inductive network is formed by inductors L1+, L2+, L1−, L2−, and L3. Inductors L1+ and L2+ are series coupled between switching devices M1+ and M2+. Inductors L1− and L2− are series coupled between switching devices M1− and M2−. Inductor L3 is coupled between the node formed between inductors L1+ and L2+ and the node formed between inductors L1− and L2−. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L1+ and L2+, the inductance between $V_{dp+}$ and $V_{dn-}$ is provided by inductors L1+, L3, and L2−, etc.). The inductances provided between all other combinations of the four nodes is clearly illustrated in FIG. 33.

Figure 34:
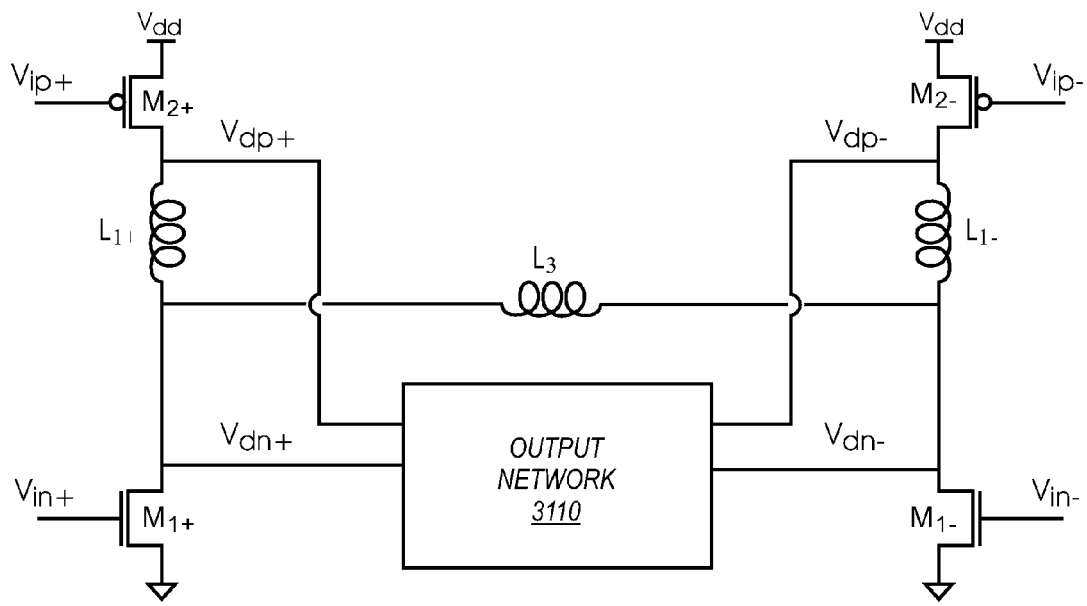
FIG. 34 is a diagram of a differential power amplifier, including another example of an inductive network.

FIG. 34 is a diagram of another differential power amplifier. The differential power amplifier shown in FIG. 34 includes a first amplifier having switching devices M1+ and M2+. A second amplifier includes switching devices M1− and M2−. An output network 3110 is coupled to nodes $V_{dn+}$, $V_{dp+}$, $V_{dn-}$, and $V_{dp-}$. An inductive network is also coupled to nodes $V_{dn+}$, $V_{dp+}$, $V_{dn-}$, and $V_{dp-}$. In this example, the inductive network is formed by inductors L1+, L1−, and L3. Inductor L1+ is coupled between switching devices M1+ and M2+. Inductor L1− is coupled between switching devices M1− and M2−. Inductor L3 is coupled between nodes $V_{dn+}$ and $V_{dn-}$. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductor L1+, the inductance between $V_{dp+}$ and $V_{dn-}$ is provided by inductors L1+ and L3, etc.).

Figure 35:
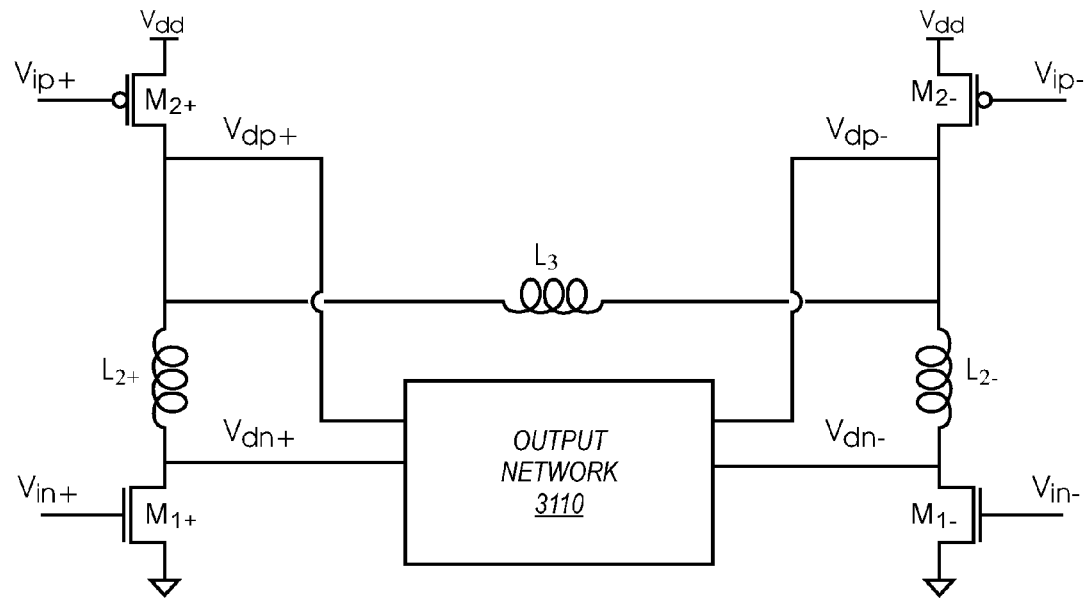
FIG. 35 is a diagram of a differential power amplifier, including another example of an inductive network.

FIG. 35 is a diagram of another differential power amplifier. The differential power amplifier shown in FIG. 35 includes a first amplifier having switching devices M1+ and M2+. A second amplifier includes switching devices M1− and M2−. An output network 3110 is coupled to nodes $V_{dn+}$, $V_{dp+}$, $V_{dn-}$, and $V_{dp-}$. An inductive network is also coupled to nodes $V_{dn+}$, $V_{dp+}$, $V_{dn-}$, and $V_{dp-}$. In this example, the inductive network is formed by inductors L2+, L2−, and L3. Inductor L2+ is coupled between switching devices M1+ and M2+. Inductor L2− is coupled between switching devices M1− and M2−. Inductor L3 is coupled between nodes $V_{dp+}$ and $V_{dp-}$. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductor L2+, the inductance between $V_{dp+}$ and $V_{dn-}$ is provided by inductors L3 and L2−, etc.).

Figure 36:
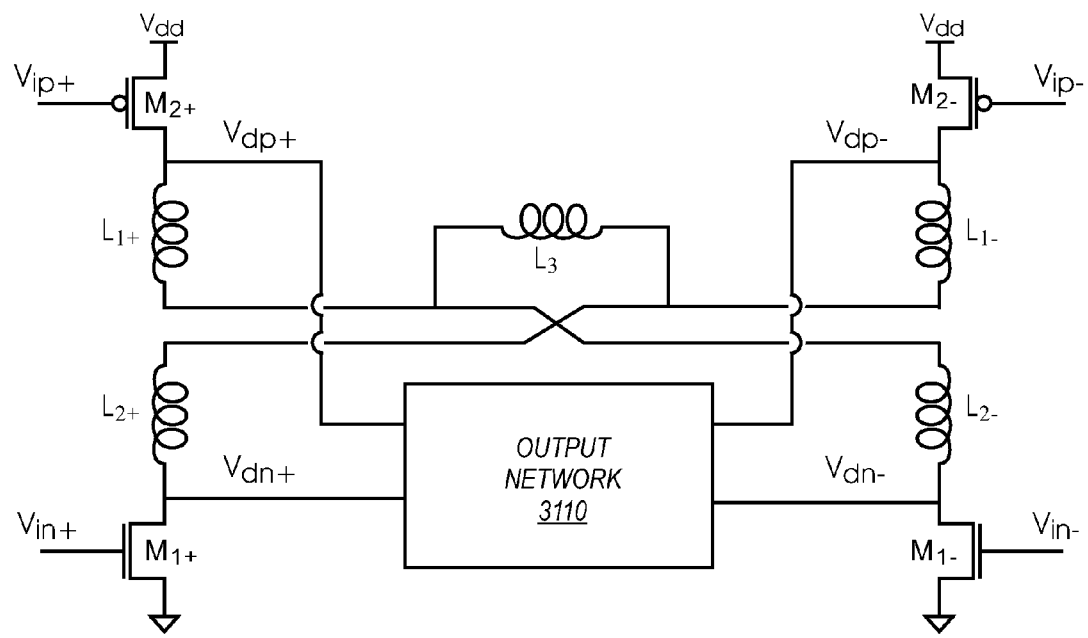
FIG. 36 is a diagram of a differential power amplifier, including another example of an inductive network.

FIG. 36 is a diagram of another differential power amplifier. The differential power amplifier shown in FIG. 36 includes a first amplifier having switching devices M1+ and M2+. A second amplifier includes switching devices M1− and M2−. An output network 3110 is coupled to nodes $V_{dn+}$, $V_{dp+}$, $V_{dn-}$, and $V_{dp-}$. An inductive network is also coupled to nodes $V_{dn+}$, $V_{dp+}$, $V_{dn-}$, and $V_{dp-}$. In this example, the inductive network is formed by inductors L1+, L2+, L1−, L2−, and L3. Inductors L1+ and L2− are coupled between switching devices M2+ and M1−. Inductors L1− and L2+ are coupled between switching devices M1+ and M2−. Inductor L3 is coupled between the node formed between inductors L1+ and L2− and the node formed between inductors L1− and L2+. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L1+, L3, and L2+, the inductance between $V_{dp+}$ and $V_{dn-}$ is provided by inductors L1+, and L2−, etc.).

The inductive networks described above can also be used in various ways in multi-stage differential power amplifier applications. For example, each power amplifier in a multi-stage power amplifier may utilize an inductive network of the present invention. In other examples, some power amplifier stages may utilize an inductive network, while others do not. In addition, inductive networks from different stages can be combined or coupled together in novel ways.

Figure 37:
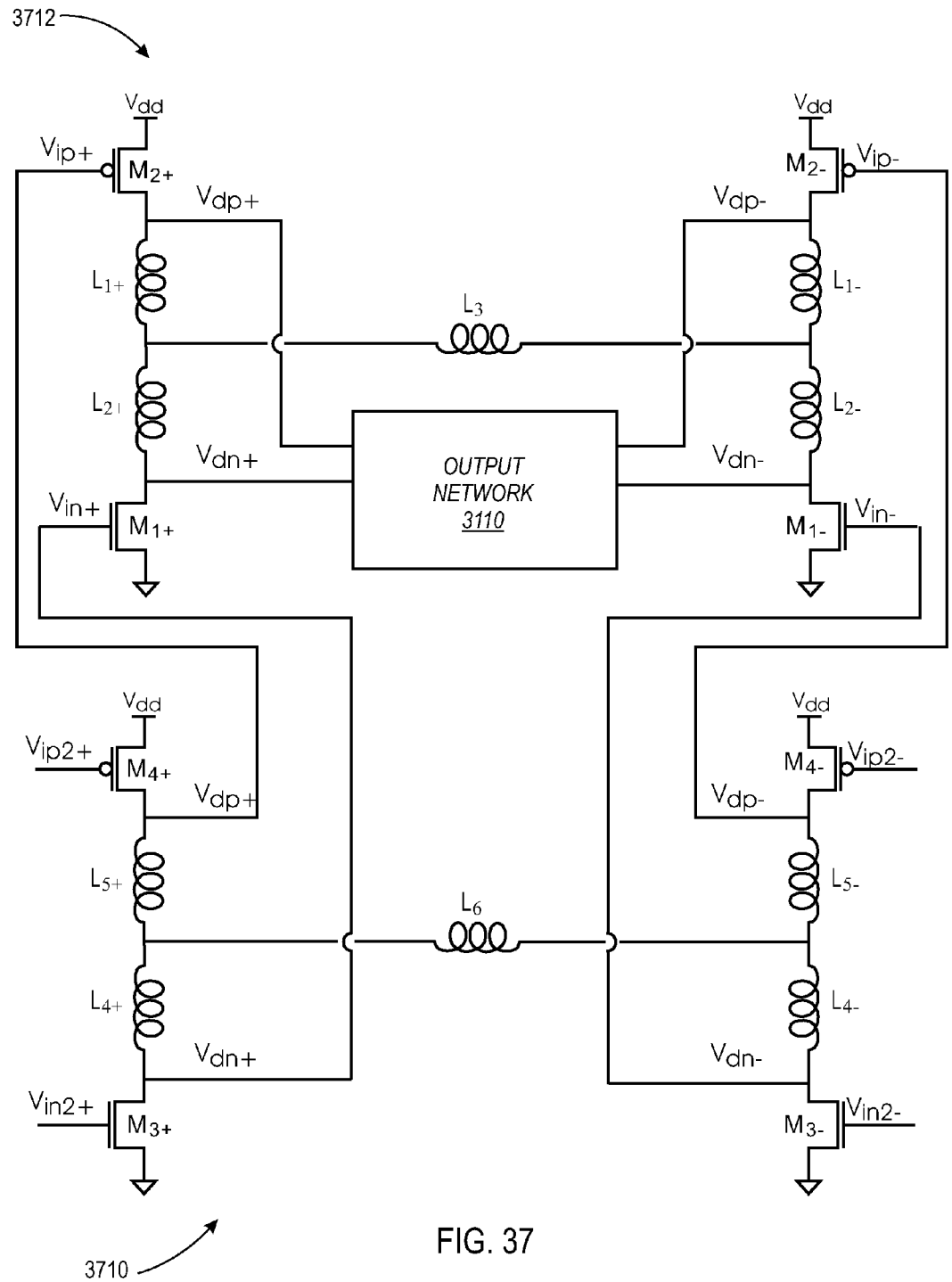
FIG. 37 is a diagram of a two-stage differential power amplifier, including examples of inductive networks.

FIG. 37 is a diagram of two power amplifier stages in a multi-stage differential power amplifier. FIG. 37 shows a first power amplifier stage 3710 having outputs coupled to the inputs of a second power amplifier stage 3712. The first power amplifier stage 3710 includes a first power amplifier, including switching devices M4+ and M3+ coupled between first and second supply voltages. The first power amplifier stage 3710 also includes a second power amplifier, including switching devices M4− and M3− coupled between third and fourth supply voltages. Note that the supply voltages coupled to switching devices M4+ and M4− may be different supplies, or be the same supplies, as desired. Similarly, the supply voltages coupled to switching devices M3+ and M3− may be different supplies, or be the same supplies, as desired. These concepts apply to the other figures as well.

The first power amplifier stage 3710 includes nodes $V_{dn+}$, $V_{dp+}$, $V_{dn-}$, and $V_{dp-}$ which are coupled to an inductive network, and to the inputs of the second power amplifier stage 3712. In the example shown in FIG. 37, the inductive network is similar to the inductive network shown in FIG. 33. In this example, the inductive network is formed by inductors L5+, L4+, L5−, L4−, and L6. Inductors L4+ and L5+ are series coupled between switching devices M3+ and M4+. Inductors L5− and L4− are series coupled between switching devices M3− and M4−. Inductor L6 is coupled between the node formed between inductors L4+ and L5+ and the node formed between inductors L4− and L5−. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L4+ and L5+, the inductance between $V_{dp+}$ and $V_{dn-}$ is provided by inductors L5+, L6, and L4−, etc.). The inductances provided between all other combinations of the four nodes are also clearly illustrated in FIG. 37.

FIG. 37 shows a second power amplifier stage 3712 having outputs coupled to the output network 3110. The second power amplifier stage 3712 includes a first power amplifier, including switching devices M1+ and M2+ coupled between fifth and sixth supply voltages. The second power amplifier stage 3712 also includes a second power amplifier, including switching devices M1− and M2− coupled between seventh and eighth supply voltages. Note that the voltage supplies described can all be separate, or be the same as other voltage supplies. For example, the first and third voltages supplies can provide the same, or different voltages. Similarly, the fifth and seventh voltage supplies can provide the same, or different voltages as each other, or the same or different voltages as the first and third voltage supplies.

The second power amplifier stage 3712 includes nodes $V_{dn+}$, $V_{dp+}$, $V_{dn-}$, and $V_{dp-}$ which are coupled to an inductive network, and to an output network 3110. In the example shown in FIG. 37, the inductive network of the second power amplifier stage 3712 is similar to the inductive network of the first power amplifier stage 3710. In this example, the inductive network is formed by inductors L1+, L2+, L1−, L2−, and L3. Inductors L1+ and L2+ are series coupled between switching devices M1+ and M2+. Inductors L1− and L2− are series coupled between switching devices M1− and M2−. Inductor L3 is coupled between the node formed between inductors L1+ and L2+ and the node formed between inductors L1− and L2−. In this example, the inductive network of the second power amplifier stage 3712 provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L1+ and L2+, the inductance between $V_{dp+}$ and $V_{dn-}$ is provided by inductors L1+, L3, and L2−, etc.). The inductances provided between all other combinations of the four nodes are also clearly illustrated in FIG. 37.

Figure 38:
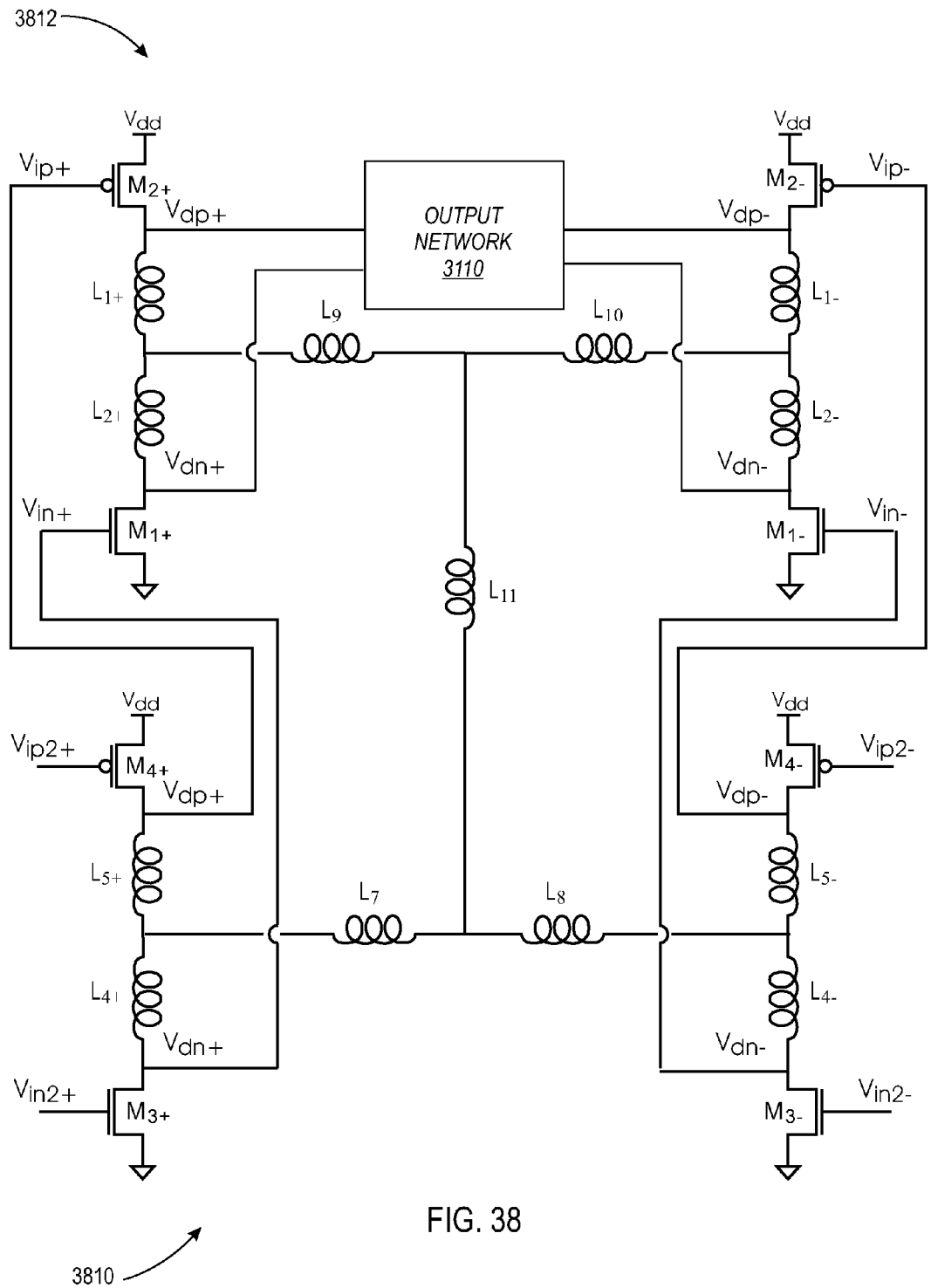
FIG. 38 is a diagram of a two-stage differential power amplifier, including other examples of inductive networks.

FIG. 38 is a diagram of two power amplifier stages in a multi-stage differential power amplifier. FIG. 38 shows a first power amplifier stage 3810 having outputs coupled to the inputs of a second power amplifier stage 3812. The first power amplifier stage 3810 includes a first power amplifier, including switching devices M4+ and M3+ coupled between first and second supply voltages. The first power amplifier stage 3810 also includes a second power amplifier, including switching devices M4− and M3− coupled between third and fourth supply voltages.

The first power amplifier stage 3810 in FIG. 38 includes nodes $V_{dn+}$, $V_{dp+}$, $V_{dn-}$, and $V_{dp-}$ which are coupled to an inductive network, and to the inputs of the second power amplifier stage 3812. In the example shown in FIG. 38, the inductive network is similar to the inductive network shown in FIG. 33. In this example, the inductive network is formed by inductors L5+, L4+, L5−, L4−, L7 and L8. Inductors L4+ and L5+ are series coupled between switching devices M3+ and M4+. Inductors L5− and L4− are series coupled between switching devices M4− and M3−. Inductors L7 and L8 are series coupled between the node formed between inductors L4+ and L5+ and the node formed between inductors L4− and L5−. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L4+ and L5+, the inductance between $V_{dp+}$ and $V_{dn-}$ is provided by inductors L5+, L7, L8, and L4−, etc.). The inductances provided between all other combinations of the four nodes are also clearly illustrated in FIG. 38.

FIG. 38 shows a second power amplifier stage 3812 having outputs coupled to the output network 3110. The second power amplifier stage 3812 includes a first power amplifier, including switching devices M1+ and M2+ coupled between fifth and sixth supply voltages. The second power amplifier stage 3812 includes a second power amplifier, including switching devices M1− and M2− coupled between seventh and eighth supply voltages.

The second power amplifier stage 3812 includes nodes $V_{dn+}$, $V_{dp+}$, $V_{dn-}$, and $V_{dp-}$ which are coupled to an inductive network, and to an output network 3110. In the example shown in FIG. 38, the inductive network of the second power amplifier stage 3812 is similar to the inductive network of the first power amplifier stage 3810. In this example, the inductive network is formed by inductors L1+, L2+, L1−, L2−, L9, and L10. Inductors L1+ and L2+ are series coupled between switching devices M1+ and M2+. Inductors L1− and L2− are series coupled between switching devices M1− and M2−. Inductors L9 and L10 are series coupled between the node formed between inductors L1+ and L2+ and the node formed between inductors L1− and L2−. In this example, the inductive network of the second power amplifier stage 3812 provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L1+ and L2+, the inductance between $V_{dp+}$ and $V_{dn-}$ is provided by inductors L1+, L9, L10, and L2−, etc.). The inductances provided between all other combinations of the four nodes is also clearly illustrated in FIG. 38.

In the example of FIG. 38, the inductive networks of the first and second power amplifier stages 3810 and 3812 are coupled together. In the example shown in FIG. 38, the first and second power amplifier stages 3810 and 3812 are coupled together by an inductance. FIG. 38 shows an inductor L11 coupled between the node formed between inductors L7 and L8 and the node formed between inductors L9 and L10. The inductance between the two inductive networks helps with the DC biasing of each power amplifier stage. The inductance also helps to reduce low frequency noise in the power amplifier. The coupling of the power amplifier stages can be implemented in any desired manner, besides that shown in FIG. 38. For example, the inductance can be connected to different nodes in the inductive networks or power amplifiers. The coupling can be implemented with other elements, such as resistors, in series with the inductor. A first end of the coupling can be coupled to any node within the inductive network for the first amplifier stage and a second end of the coupling can be coupled to any node within the inductive network for the second amplifier stage.

Figure 39:
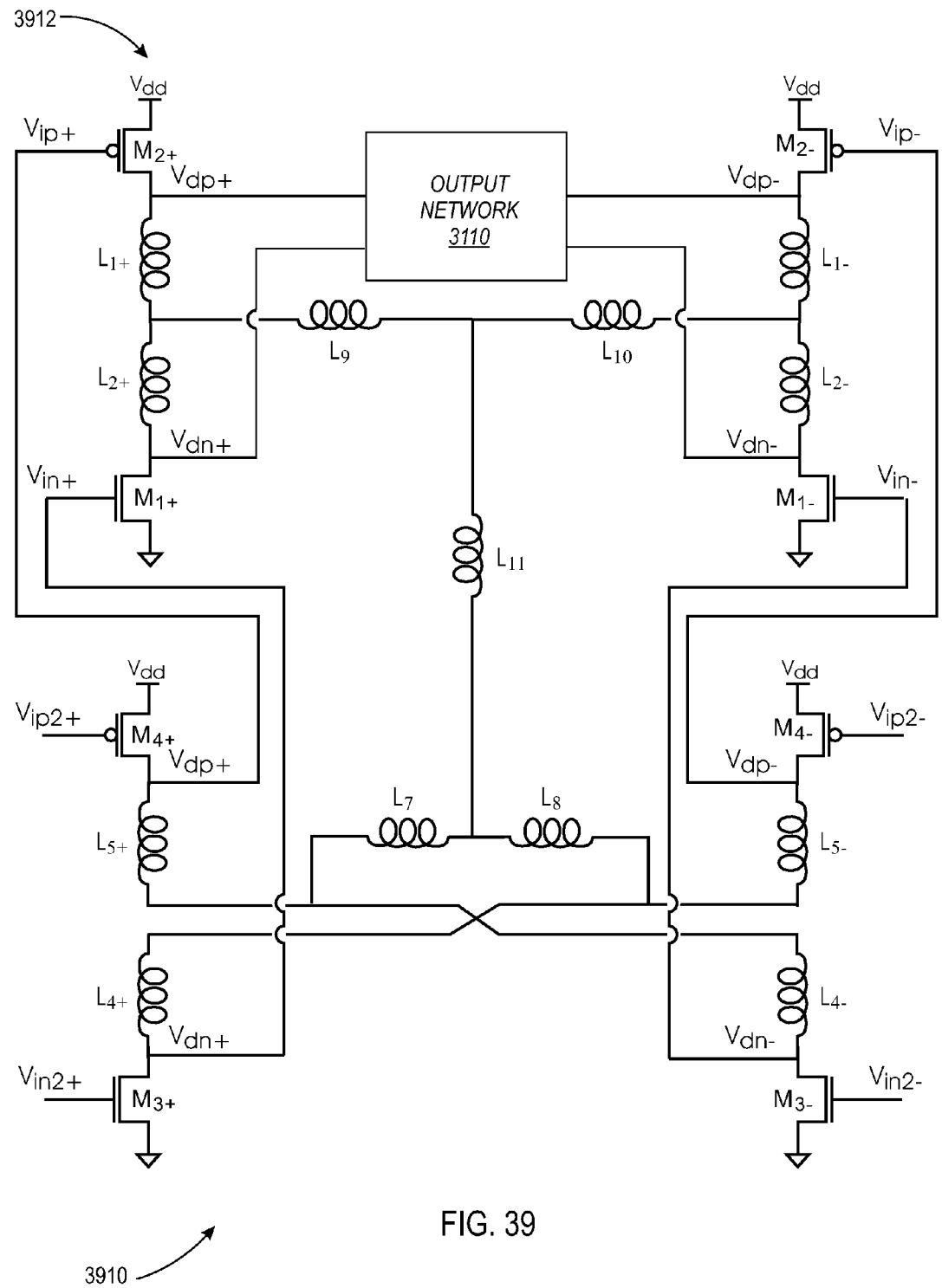
FIG. 39 is a diagram of a two-stage differential power amplifier, including other examples of inductive networks.

FIG. 39 is a diagram of two power amplifier stages in a multi-stage differential power amplifier. The power amplifier shown in FIG. 39 is similar to the power amplifier shown in FIG. 38, with a different inductive network in the first stage. FIG. 39 shows a first power amplifier stage 3910 having outputs coupled to the inputs of a second power amplifier stage 3912. The first power amplifier stage 3910 includes a first power amplifier, including switching devices M4+ and M3+ coupled between first and second supply voltages. The first power amplifier stage 3910 includes a second power amplifier, including switching devices M4− and M3− coupled between third and fourth supply voltages.

The first power amplifier stage 3910 in FIG. 39 includes nodes $V_{dn+}$, $V_{dp+}$, $V_{dn-}$, and $V_{dp-}$ which are coupled to an inductive network, and to the inputs of the second power amplifier stage 3912. In the example shown in FIG. 39, the inductive network is similar to the inductive network shown in FIG. 36. In this example, the inductive network is formed by inductors L5+, L4+, L5−, L4−, L7 and L8. Inductors L5+ and L4− are series coupled between switching devices M4+ and M3−. Inductors L5− and L4+ are series coupled between switching devices M4− and M3+. Inductors L7 and L8 are series coupled between the node formed between inductors L5+ and L4− and the node formed between inductors L5− and L4+. In this example, the inductive network provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L5+, L7, L8, and L4+, the inductance between $V_{dp+}$ and $V_{dn-}$ is provided by inductors L5+, and L4−, etc.). The inductances provided between all other combinations of the four nodes are also clearly illustrated in FIG. 39.

FIG. 39 shows a second power amplifier stage 3912 having outputs coupled to the output network 3110. The second power amplifier stage 3912 includes a first power amplifier, including switching devices M1+ and M2+ coupled between fifth and sixth supply voltages. The second power amplifier stage 3912 includes a second power amplifier, including switching devices M1− and M2− coupled between seventh and eighth supply voltages.

The second power amplifier stage 3912 includes nodes $V_{dn+}$, $V_{dp+}$, $V_{dn-}$, and $V_{dp-}$ which are coupled to an inductive network, and to an output network 3110. In this example, the inductive network is formed by inductors L1+, L2+, L1−, L2−, L9, and L10. Inductors L1+ and L2+ are series coupled between switching devices M1+ and M2+. Inductors L1− and L2− are series coupled between switching devices M1− and M2−. Inductors L9 and L10 are series coupled between the node formed between inductors L1+ and L2+ and the node formed between inductors L1− and L2−. In this example, the inductive network of the second power amplifier stage 3912 provides an inductance between each of the nodes $V_{dn+}$, $V_{dp+}$, $V_{dn-}$, and $V_{dp-}$ (e.g., the inductance between $V_{dp+}$ and $V_{dn+}$ is provided by inductors L1+ and L2+, the inductance between $V_{dp+}$ and $V_{dn-}$ is provided by inductors L1+, L9, L10, and L2−, etc.). The inductances provided between all other combinations of the four nodes are also clearly illustrated in FIG. 39.

In the example of FIG. 39, the inductive networks of the first and second power amplifier stages 3910 and 3912 are coupled together. In the example shown in FIG. 39, the first and second power amplifier stages 3910 and 3912 are coupled together by an inductance. FIG. 39 shows an inductor L11 coupled between the node formed between inductors L7 and L8 and the node formed between inductors L9 and L10. The coupling of the power amplifier stages can be implemented with other elements, such as resistors, in series with the inductor. A first end of the coupling can be coupled to any node within the inductive network for the first amplifier stage and a second end of the coupling can be coupled to any node within the inductive network for the second amplifier stage.

As mentioned before, one problem with RF power amplifiers relates to the stability of the amplifiers. Stability can be a particular problem when multiple power amplifiers are coupled together to a common load. In such a configuration, there can be multiple loops, each of which must be stabilized.

Generally, the present invention is comprised of multiple coupled power amplifiers which present several common-mode feedback loops that are stabilized using one or more techniques based on the principle that resistive loading introduces loss to each common-mode loop to reduce the gain of each common-mode loop. At the same time, resistive loading of the differential-mode of the power amplifier circuitry is not desirable because introducing loss to the differential-mode signal path decreases performance. The techniques described below strike a balance between decreasing the gains of the various common-modes of the power amplifier circuitry while increasing the performance of the differential-mode signal path of the power amplifier circuitry.

A first technique uses one or more pairs of switching devices in a cross-coupled configuration to load the common-mode of the power amplifier with a positive resistance, while loading the differential-mode of the power amplifier with a negative resistance to increase performance. In one example, the drain/gate terminals of the cross-coupled pair are coupled to the gate terminals of switching devices of a power amplifier (described in detail below). In some examples, a plurality of pairs of cross-coupled devices are coupled to a power amplifier. Additional examples of cross-coupled device configurations are described below, in addition to the examples described above (e.g., see FIGS. 10, 11, and 14). Another technique, which may be used separately or in combination with the previously mentioned technique, provides resistances coupled diagonally to switching devices in a power amplifier (such as the differential power amplifiers described above). Each of these techniques are described in more detail below.

One important consideration when applying stabilization techniques to a power amplifier design relates to how an applied technique affects other portions of a circuit. For example, a technique applied to one portion of a circuit to suppress the gain of a common-mode loop may increase the gain of a different common-mode loop. While addressing one common-mode loop, a circuit designer should take into account the effect that a stabilization technique has on other loops in the power amplifier circuitry.

Figure 40:
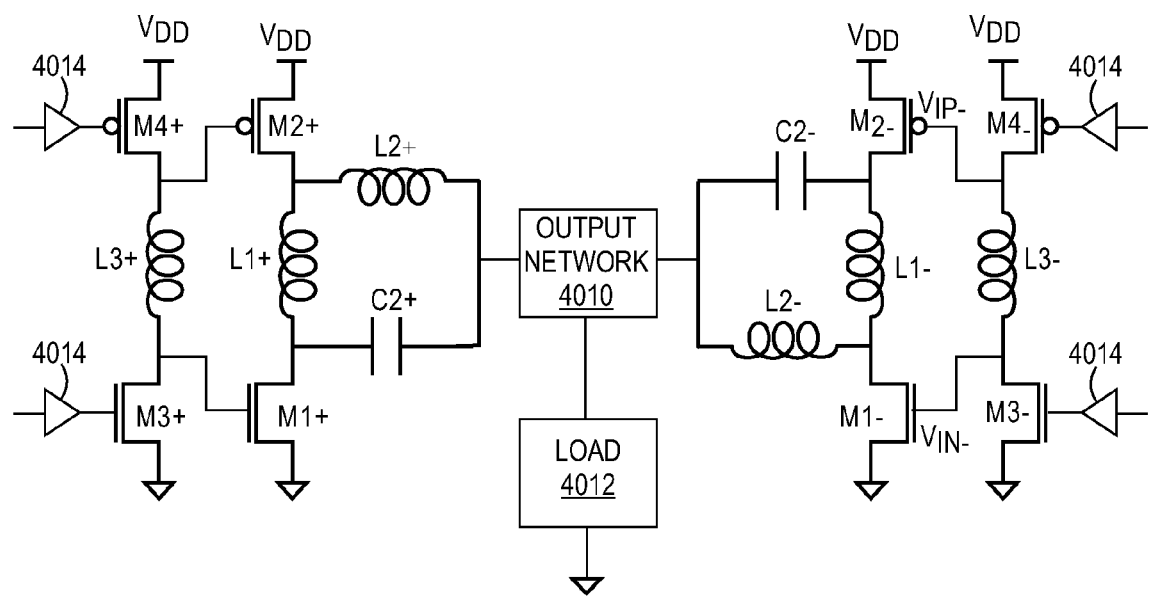
FIG. 40 is a simplified schematic diagram of a multi-stage differential power amplifier.

FIG. 40 is a schematic diagram of a multi-stage differential power amplifier. FIG. 40 can be thought of as a simplified version of the differential power amplifiers described above (e.g., see FIG. 14, etc.). FIG. 40 shows a first power amplifier stage including switching devices M1+, M2+, M1−, M2−, and inductors L1+ and L1− (in this example, this stage is the output stage of the power amplifier). The output stage of the power amplifier is coupled to a matching network, an output network 4010, and a load 4012. In this example, the matching network includes inductors L2+ and L2− and capacitors C2+ and C2−. Note that components of the matching network may be a part of the output network 4010, and visa versa, but for clarity, the components are partitioned and described as shown. Another amplifier stage includes switching devices M3+, M4+, M3−, M4−, and inductors L3+ and L3−. In this example, this stage service as a preamplifier to the output stage. FIG. 40 generically shows amplifiers 4014, which represent any desired number of additional amplifier stages. Also note that the present invention may also be applied to single stage differential power amplifiers.

Figure 41:
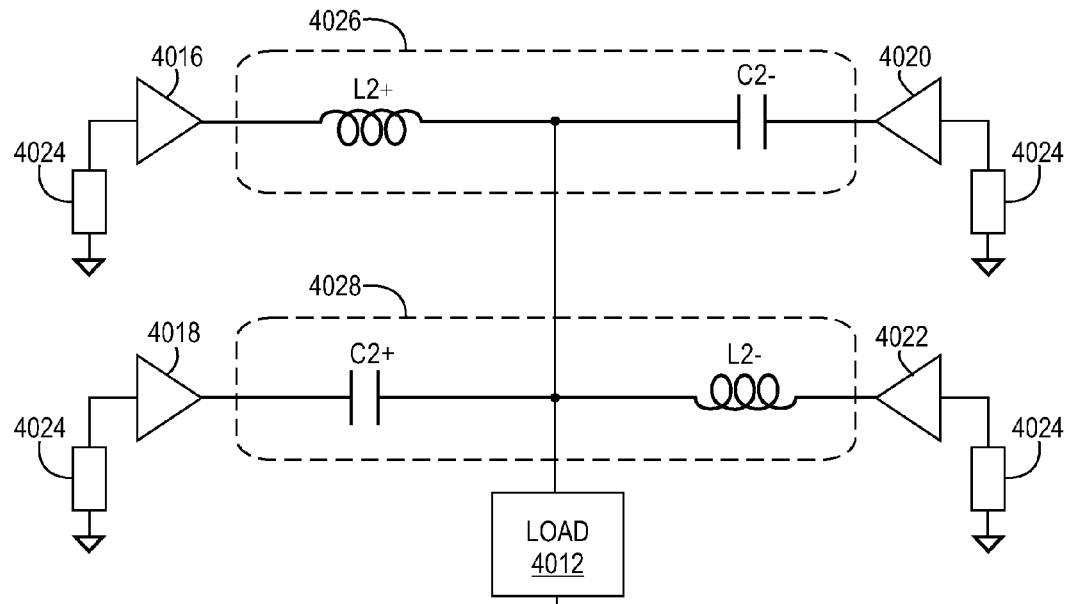
FIGS. 41 is a schematic diagram that depicts the horizontal common-mode of the output stage of the differential power amplifier shown in FIG. 40.
Figure 42:
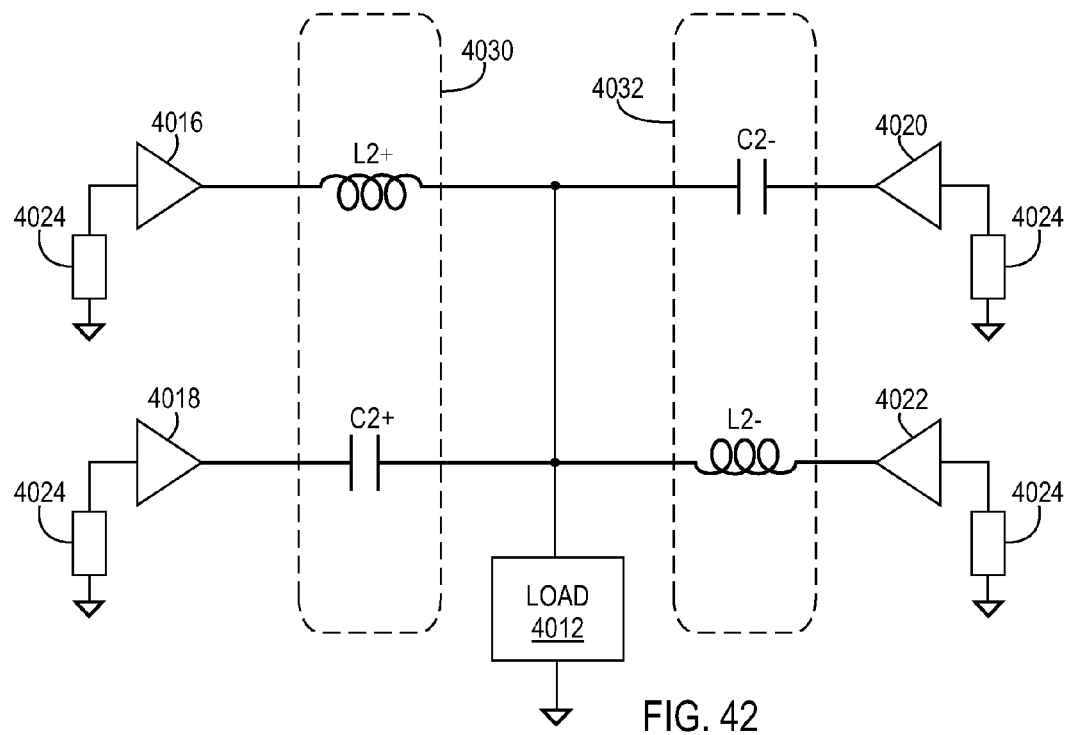
FIGS. 42 is a schematic diagram that depicts the vertical common-mode of the output stage of the differential power amplifier shown in FIG. 40.

FIGS. 41-42 are schematic diagrams that represent a simplified version of the output stage of the differential power amplifier shown in FIG. 40, with the output filter and trap ignored. FIGS. 41 and 42 show four amplifiers labeled 4016, 4018, 4020, and 4022, which correspond to the switching devices M2+, M1+, M2−, and M1−, respectively, shown in FIG. 40. For clarity, all of the other amplifier stages are represented by elements 4024, as shown. FIGS. 41 and 42 illustrate two different common-modes of operation that can be forced in the power amplifier output stage under certain load conditions. In FIG. 41, two tank circuits 4026 and 4028 are illustrated by dashed lines. The tank circuit 4026 includes inductor L2+ and capacitor C2−, and is coupled between amplifiers 4016 and 4020. The tank circuit 4028 includes inductor L2− and capacitor C2+, and is coupled between amplifiers 4018 and 4022. In FIG. 42, two tank circuits 4030 and 4032 are illustrated by dashed lines. The tank circuit 4030 includes inductor L2+ and capacitor C2+, and is coupled between amplifiers 4016 and 4018. The tank circuit 4032 includes inductor L2− and capacitor C2−, and is coupled between amplifiers 4020 and 4022. For the purposes of this description, the tanks 4026 and 4028 can be thought of as "horizontal tanks" and the tanks 4030 and 4032 can be thought of as "vertical tanks." Of course, this terminology is merely for convenience in distinguishing tanks 4026 and 4028 with tanks 4030 and 4032, as the horizontal and vertical orientations of the tanks is merely a function of the relative orientation of the elements on the circuit diagram.

Referring again to FIG. 41, under certain conditions, the tank circuits 4026 and 4028 may resonate, forcing the circuit to prefer a "horizontal" common-mode of operation. For example, if the differential power amplifier is used with a cellular telephone, the load presented by the antenna may appear as an open circuit (a high impedance load), under certain conditions. In this example, at the frequency for which tank circuit 4026 resonates, a low impedance connects the drains of the switching devices in amplifiers 4016 and 4020. Similarly, at the frequency for which the tank circuit 4028 resonates, a low impedance connects the drains of the switching devices in amplifiers 4018 and 4024. This condition prefers a horizontal common-mode of operation over the intended differential-mode, and this horizontal common-mode amplifier could be unstable under certain conditions. It is therefore desirable to stabilize the horizontal common-mode configuration of the power amplifier circuit. In one example, the stability can be improved by loading the horizontal common-mode amplifier with loss.

Figure 43:
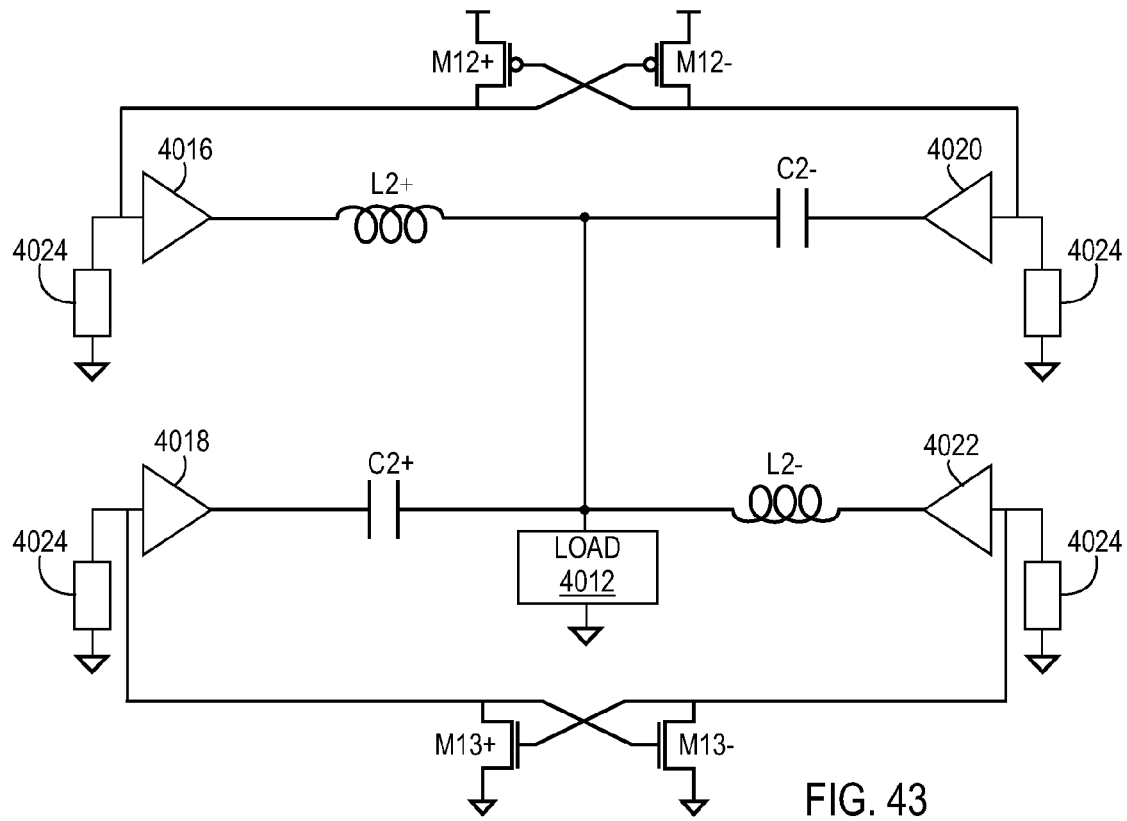
FIG. 43 is a schematic diagram showing the power amplifier of FIG. 41, with cross-coupled switching devices coupled to the amplifier inputs.

One technique for stabilizing the power amplifier circuit is to provide a resistive load to the common-mode loops in the power amplifier circuit by coupling cross-coupled switching devices to the power amplifiers 4016 and 4020 and to the power amplifiers 4018 and 4022. Note that in the figures described above, examples of such devices are provided (e.g., see FIGS. 10, 11, and 14). FIG. 43 is a schematic diagram showing the power amplifier of FIG. 41, with cross-coupled switching devices (in this example, FETs) coupled to the amplifiers. A first pair of switching devices M12+ and M12− are arranged in a cross-coupled configuration, and coupled to the inputs of amplifiers 4016 and 4020. As shown, the drain of switching device M12+ and the gate of switching device M12− are coupled to the input of the amplifier 4016. Similarly, the drain of switching device M12− and the gate of switching device M12+ are coupled to the input of the amplifier 4020. A second pair of switching devices M13+ and M13− are arranged in a cross-coupled configuration, and coupled to the inputs of amplifiers 4018 and 4022. As shown, the drain of switching device M13+ and the gate of switching device M13− are coupled to the input of the amplifier 4018. Similarly, the drain of switching device M13− and the gate of switching device M13+ are coupled to the input of the amplifier 4022. In this example, the switching devices M12+ and M12− are PMOS FETs, and are coupled to PMOS switching devices of the amplifiers 4016 and 4020. Likewise, the switching devices M13+ and M13− are NMOS FETs, and are coupled to NMOS switching devices of the amplifiers 4018 and 4024.

Figure 44:
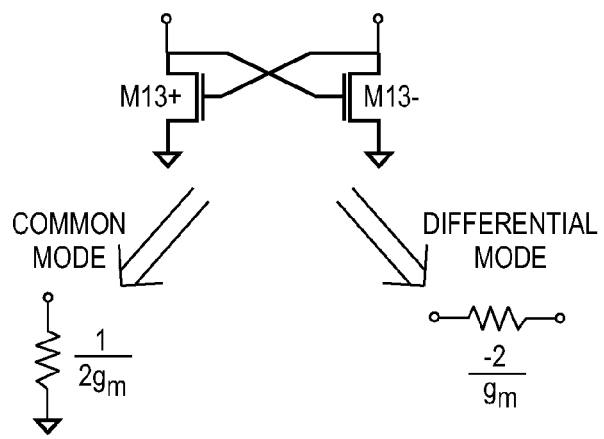
FIG. 44 is a diagram showing a pair of cross-coupled devices and illustrating equivalent circuits in the common-mode and the differential mode of operation.

The cross-coupled devices load the horizontal common-mode amplifier with a positive resistance, decreasing the gain of the horizontal common-mode loop to stabilize the horizontal common-mode configuration of the power amplifier. However, the cross-coupled devices load the desired differential-mode of the power amplifier with a negative resistance, which boosts the differential mode gain. FIG. 44 is a diagram showing a pair of cross-coupled devices and illustrating equivalent circuits in the common-mode of operation and in the differential mode of operation. As shown, in the common-mode, a resistive load is provided, with a value equal to the inverse of $2 \cdot g_m$, where $g_m$ is the transconductance of each switching device (i.e., the transconductance of FET M13+ and M13−). In the differential mode, a negative resistive load is provided, with a value equal to $-2/g_m$. Therefore, it can be seen that the cross-coupled devices will help to stabilize the common-mode of the power amplifier while increasing the performance of the differential-mode of the power amplifier. Note that any passive resistance coupled to a common-mode circuit may affect the differential mode circuit, unless the resistance is coupled to a virtual ground.

One design consideration when implementing cross-coupled devices to help stabilize a power amplifier is the size of the cross-coupled devices. The cross-coupled devices should be made large enough that the common-mode resistance is sufficient to stabilize the common-mode loop of the power amplifier. However, if the cross-coupled devices are made too large, the differential-mode negative resistance can become small enough to destabilize the differential-mode of the power-amplifier. In one example, the width of the FETs can be increased until the common-mode resistance is small enough to stabilize power amplifier in common-mode operation.

If desired, additional pairs of cross-coupled devices can also be used in addition to or instead of cross-coupled devices M12+, M12−, M13+, M13− to improve stability of the amplifier. For example, in addition to the cross-coupled devices shown in FIG. 43, one or more pairs of cross-coupled devices could also be coupled to the outputs of the amplifiers 4016, 4018, 4020, and 4022. For example, referring back to FIG. 14, a pair of cross-coupled devices M8+ and M8− are coupled to the inputs of switching devices M2+ and M2−. In addition, another pair of cross-coupled devices M4+ and M4− are coupled to the outputs of switching devices M2+ and M2−.

Another design consideration when implementing cross-coupled devices to help stabilize a power amplifier is that the negative resistance provided in the differential mode may result in differential-mode instability and self-oscillation. The differential-mode drive signal must remain large to injection-lock all potential differential-mode instabilities.

Figure 45:
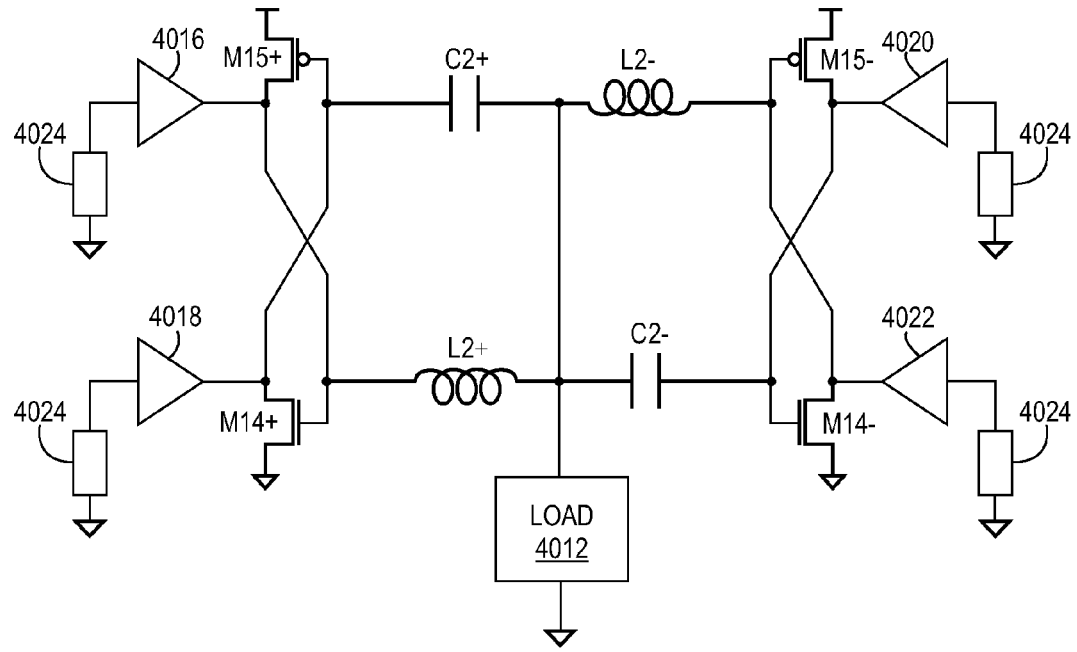
FIG. 45 is a schematic diagram showing the power amplifier of FIG. 42, with cross-coupled switching devices coupled to the amplifier outputs.

Referring again to FIG. 42, under certain condition, the tank circuits 4030 and 4032 may resonate, forcing the amplifiers 4016 and 4018 and amplifiers 4020 and 4022 to prefer a vertical common-mode of operation that could be unstable under certain conditions. In this mode, the outputs of the amplifiers 4016 and 4018, and the outputs of the amplifiers 4020 and 4022 are connected by a low impedance at the frequency for which tank circuits 4030 and 4032 resonate. It is therefore desirable to stabilize the vertical common-mode of the power amplifier circuit. The technique described above with respect to "horizontal" common-mode can also be applied to the "vertical" common-mode. Again, one technique for stabilizing the power amplifier circuit is to provide a resistive load to the vertical common-mode of the power amplifier circuit by coupling cross-coupled switching devices to the power amplifiers 4016 and 4018 and to the power amplifiers 4020 and 4022. FIG. 45 is a schematic diagram showing the power amplifier of FIG. 42, with cross-coupled switching devices (in this example, FETs) coupled to the amplifier outputs. It should be noted that additional cross-coupled devices could be added to the amplifier inputs in combination with or instead of the cross-coupled devices shown in FIG. 42. A first pair of switching devices M14+ and M15+ are arranged in a cross-coupled configuration, and coupled to the outputs of amplifiers 4018 and 4016. As shown, the drain of switching device M15+ and the gate of switching device M14+ are coupled to the output of the amplifier 4016. Similarly, the drain of switching device M14+ and the gate of switching device M15+ are coupled to the output of the amplifier 4018. A second pair of switching devices M14− and M15− are arranged in a cross-coupled configuration, and coupled to the outputs of amplifiers 4022 and 4020. As shown, the drain of switching device M15− and the gate of switching device M14− are coupled to the output of the amplifier 4020. Similarly, the drain of switching device M14− and the gate of switching device M15− are coupled to the output of the amplifier 4022. As before, the cross-coupled devices M14+, M14−, M15+, and M15− present negative resistance to the differential-mode in order to increase performance of the differential-mode, and present positive resistance to the vertical common-mode (in this example, the value of the resistance is equal to $2/g_m$) to stabilize the vertical common-mode by increasing common-mode loss.

One potential problem with the techniques described above is that the application of cross-coupled devices to address one common-mode loop (e.g., the "horizontal" common-mode (FIG. 43)) adversely affects the other common-mode loop. For example, the application of the "horizontal" cross-coupled devices M12+, M12−, M13+, and M13− will help to stabilize the "horizontal" common-mode loop, but will tend to destabilize the "vertical" common-mode loop. Likewise, the application of the "vertical" cross-coupled devices M14+, M15+, M14−, and M15− will help to stabilize the "vertical" common-mode loop, but will tend to destabilize the "horizontal" common-mode loop. In other words, the devices that stabilize the horizontal common-mode destabilize the vertical common-mode, and visa versa. It therefore may also be an important design consideration to carefully balance the application of these techniques to achieve a desired result, as well as to apply additional techniques, such as the technique described below.

Figure 46:
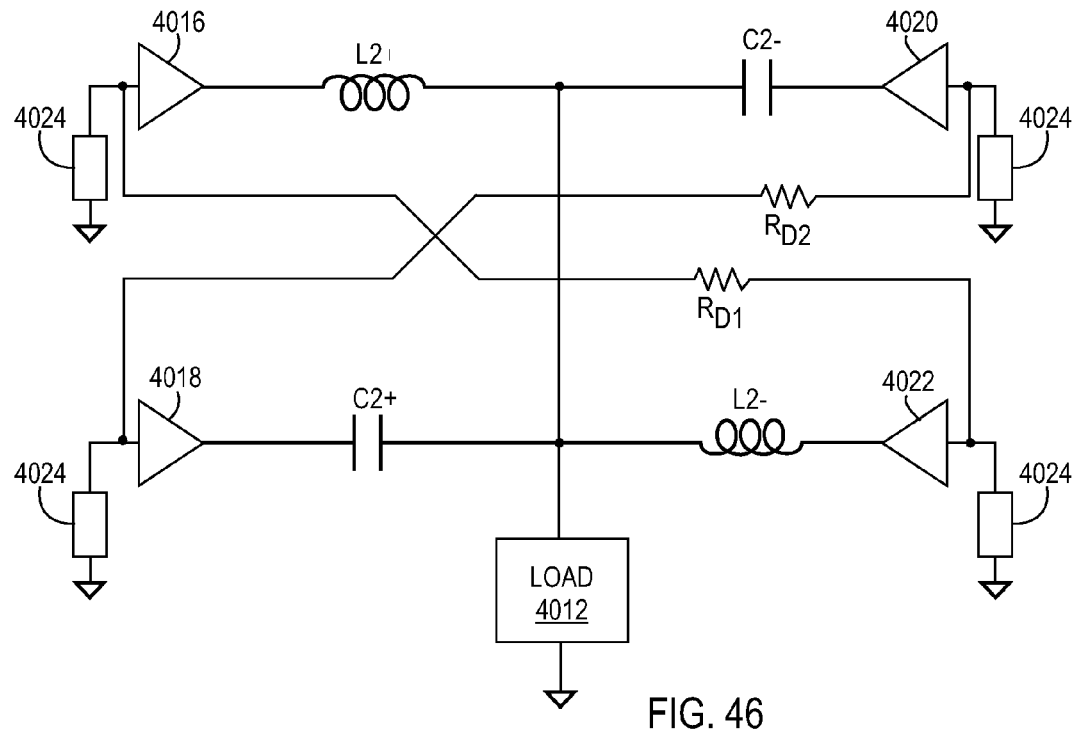
FIG. 46 is a schematic diagram showing the differential power amplifier of FIG. 41, and the application of diagonally coupled resistors.

Another technique for stabilizing common-mode configurations of the power amplifier circuit without compromising differential-mode performance is to provide resistances diagonally to the inputs of switching devices in a power amplifier (such as the differential-mode power amplifiers described above). Like the terms "horizontal" and "vertical" referenced above, the term "diagonal" is used for convenience in describing the connection of resistors. This technique is capable of stabilizing all common-modes (i.e., both the "horizontal" and "vertical" common-modes). FIG. 46 is a schematic diagram showing the simplified differential power amplifier shown in FIG. 41, with this technique applied to the inputs of the power amplifier. It should be noted that additional diagonal resistors could be applied to the outputs of the power amplifier in combination with or instead of the resistors shown in FIG. 41. FIG. 46 shows the amplifiers 4016, 4018, 4020, and 4022, which correspond to the switching devices M2+, M1+, M2−, and M1−, respectively, shown in FIG. 40. For clarity, all of the other amplifier stages are represented by elements 4024, as shown.

As shown in FIG. 46, a first resistor $R_{D1}$ is coupled between the input of amplifier 4016 and the input of amplifier 4022. Similarly, second resistor $R_{D2}$ is coupled between the input of amplifier 4018 and the input of amplifier 4020. In one example, the resistors $R_{D1}$ and $R_{D2}$ are coupled to the gates of the amplifier switching devices, such as switching devices M3+, M3−, M4+, and M4−, shown in FIG. 40. Note that, during normal operation of the power amplifier, the inputs to amplifiers 4016 and 4022 and the inputs to amplifiers 4018 and 4020 are in phase and very little current will flow through resistors $R_{D1}$ and $R_{D2}$. Therefore, efficiency of the differential-mode of the power amplifier circuit is degraded very little by use of the resistors $R_{D1}$ and $R_{D2}$. However, resistors $R_{D1}$ and $R_{D2}$ stabilize the common-mode of the power amplifier circuit by adding loss to the common-mode configuration.

Figure 47:
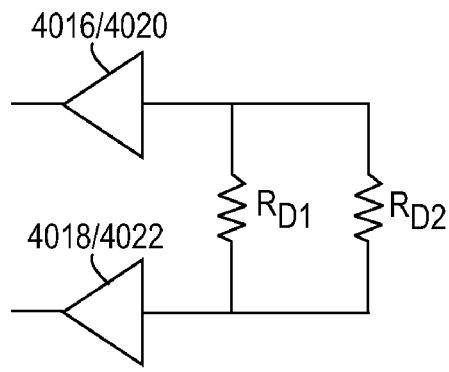
FIG. 47 is a diagram of an equivalent circuit illustrating how diagonally-coupled resistors load the horizontal common-mode of a power amplifier.
Figure 48:
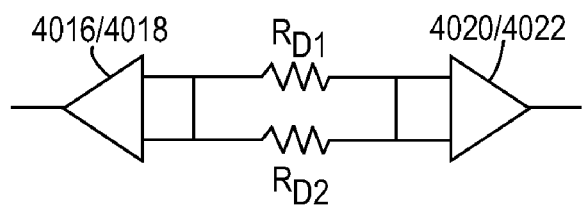
FIG. 48 is a diagram of an equivalent circuit illustrating how diagonally-coupled resistors load the vertical common-mode of a power amplifier.

FIG. 47 is an equivalent diagram illustrating how the resistors $R_{D1}$ and $R_{D2}$ load the common-mode loop in the "horizontal" common-mode (resulting from tank circuits 4026 and 4028 shown in FIG. 41). As shown the resistors $R_{D1}$ and $R_{D2}$ provide a load between the combination of amplifiers 4016 and 4020 and the combination of amplifiers 4018 and 4022. Similarly, FIG. 48 is an equivalent diagram illustrating how the resistors $R_{D1}$ and $R_{D2}$ load the common-mode loop in the "vertical" common-mode (resulting from tank circuits 4030 and 4032 shown in FIG. 42). As shown, the resistors $R_{D1}$ and $R_{D2}$ provide a load between the combination of amplifiers 4016 and 4018 and the combination of amplifiers 4040 and 4022.

As mentioned above, all of the techniques described can be used independently, or in combination, to help stabilize the common-mode operation of a power amplifier. In one example, a power amplifier is stabilized using the following techniques. First, "horizontal" cross-coupled devices are added to the inputs and/or outputs of the power amplifier to stabilize the "horizontal" common-mode operation (see FIGS. 41 and 43). Second, "vertical" cross-coupled devices are added to the inputs and/or outputs of the power amplifier to stabilize the "vertical" common-mode operation (see FIGS. 42 and 45). Third, resistors are coupled diagonally to the inputs and/or outputs of the four amplifiers (see FIG. 46).

Figure 49:
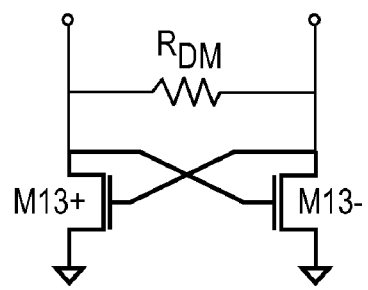
FIG. 49 shows a configuration of cross-coupled devices together with a resistor.

When designing a circuit using these techniques (using the techniques alone or in any combination), the application of each technique can be balanced and tweaked to achieve a desired result. For example, when applying cross-coupled devices to a power amplifier, a designer can vary parameters such as the number of cross-coupled devices, the locations of the cross-coupled devices, the sizes of the cross-coupled devices, the configuration of the cross-coupled devices, the number of diagonal resistors, the locations of the diagonal resistors, the sizes of the diagonal resistors, and the configuration of the diagonal resistors to address a particular mode of instabilty. With respect to the configuration of the cross-coupled devices, numerous variations are possible. In the examples described above, two switching devices are arranged as shown. In another example, resistance can be added between the drains and gates of the cross-coupled devices. FIG. 49 shows cross-coupled devices M13+ and M13−, with an additional resistance $R_{DM}$ coupled between the drains and gates of the devices M13+ and M13−. The differential-mode resistance $R_{DM}$ is shorted out in the common-mode (e.g., see FIG. 44), however the resistance $R_{DM}$ adds to the negative resistance of the cross-coupled devices to make the total differential-mode less negative. This type of configuration may be desirable if the negative differential mode conductance is a problem. Therefore, it can be seen that using resistance $R_{DM}$ allows the differential mode impedance to be adjusted independently from the common-mode impedance. Other configurations of cross-coupled devices are also possible.

Figure 50:
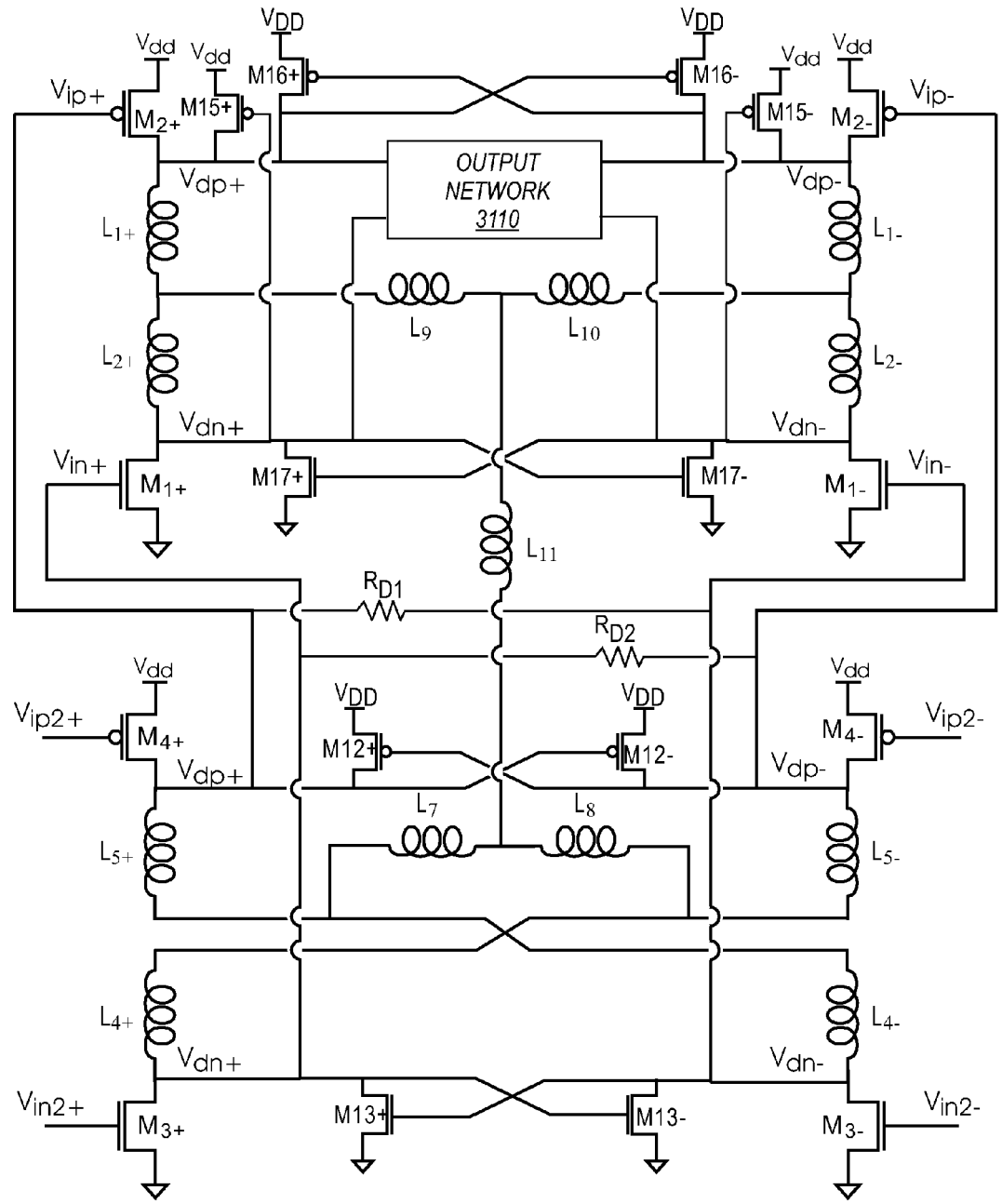
FIG. 50 is a schematic diagram of power amplifier circuit illustrating an example of the application of a combination of several stabilization techniques.

FIG. 50 is a schematic diagram of a power amplifier circuit illustrating an example of the application of a combination of several techniques. Generally, FIG. 50 shows a power amplifier circuit like that shown in FIG. 39. In addition, a plurality of pairs of cross-coupled devices (e.g., like those shown in FIG. 14) and diagonal coupled resistors (e.g., like those shown in FIG. 46) are shown.

FIG. 50 shows two stages of a power amplifier. An output stage includes switching devices M1+, M1−, M2+, and M2−, along with the inductive network shown. Another amplifier stage includes switching devices M3+, M3−, M4+, and M4−, along with the inductive network shown. A plurality of pairs of cross-coupled devices stabilize the common-modes by introducing positive resistance (loss) A first pair of cross-coupled devices is comprised of switching devices M12+ and M12−, and is coupled to the inputs of switching devices M2+ and M2− of the output stage. A second pair of cross-coupled devices is comprised of switching devices M13+ and M13−, and is coupled to the inputs of switching devices M1+ and M1− of the output stage. A third pair of cross-coupled devices is comprised of switching devices M16+ and M16−, and is coupled to the outputs of switching devices M2+ and M2− of the output stage. A fourth pair of cross-coupled devices is comprised of switching devices M17+ and M17−, and is coupled to the outputs of switching devices M1+ and M1− of the output stage. A pair of pull-up devices is comprised of switching devices M15+ and M15−, and is coupled to the outputs of switching devices M2+ and M2− of the output stage, as shown. Pull-up devices are an example of vertical cross-coupled device pairs with one half of each pair sized down to zero such that no device remains. It can desirable to scale cross-coupled pairs in this fashion to one or more vertical or horizontal pairs to improve stability in a power amplifier while compensating for some other imbalance in that power amplifier. A single device arranged in this fashion can be considered a conceptual cross-coupled "pair" which still presents a negative resistance to the differential-mode and a positive resistance to the common-mode. In addition to the cross-coupled devices, a diagonally coupled resistor $R_{D1}$ is coupled between the gate of switching device M2+ and the gate of switching device M1−. A second diagonally coupled resistor $R_{D2}$ is coupled between the gate of switching device M2− and the gate of switching device M1+.

Another aspect of the present invention relates to a circuit and method of providing differential-to-single ended output conversion and impedance transformation from differential signals. Differential circuits have a number of advantages that are well known. For example, the impact from noise sources is reduced since these signals are common-mode (i.e., the positive and negative sides are effected identically). In addition, even-order harmonics are reduced because of circuit symmetry. Because of these and other advantages, a differential configuration may be desirable even when the load is single-ended. If a single-ended load is needed, circuitry for differential-to-single-ended conversion is needed.

Figure 15:
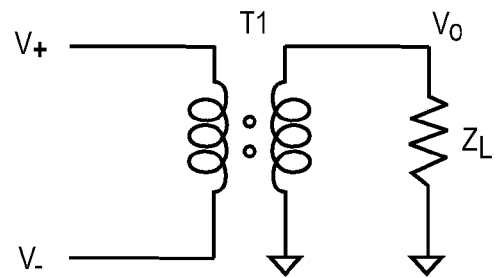
FIG. 15 is a schematic diagram of a prior art circuit used for performing differential-to-single-ended conversion.

One prior art method for performing differential-to-single-ended conversion at high frequency involves use of a transformer or balun. FIG. 15 shows a prior art circuit used for performing differential-to-single-ended conversion using a transformer T1. The primary side of the transformer T1 is connected to a first differential input $V_+$ and a second differential input $V_-$. The secondary side of the transformer T1 is connected to ground and an output node $V_O$. A load $Z_L$ is connected between ground and the output node $V_O$. If the transformer has a 1-to-1 turns ratio, then the differential signals $V_+$ and $V_-$ are translated into a signal having an amplitude of $(V_+ - V_-)$ across the load $Z_L$.

In some applications, impedance matching or impedance transformation is needed to transform a given load impedance into a different impedance seen by the driver. Impedance transformation can be accomplished, as part of the differential-to-single ended conversion, using the transformer circuit shown in FIG. 15 by adjusting the winding ratio of the transformer T1. However, the use of transformers for differential-to-single-ended conversion and impedance transformation has disadvantages. First, high quality transformers are larger and more costly than other passive elements and are not easily integrated with other semiconductor circuits. Second, practical transformers have imperfect magnetic coupling which causes a loss of power from input to output.

Figure 16:
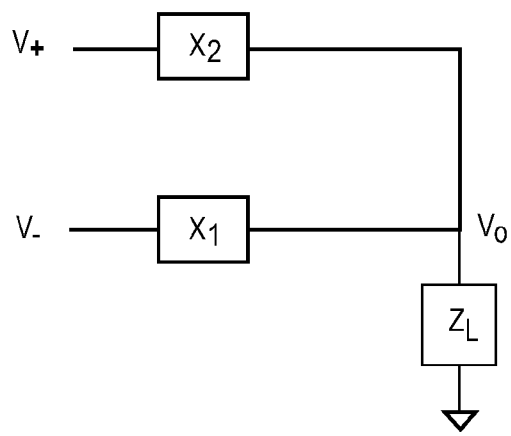
FIG. 16 is a block diagram of a differential-to-single-ended conversion and impedance transformation circuit of the present invention.
Figure 17:
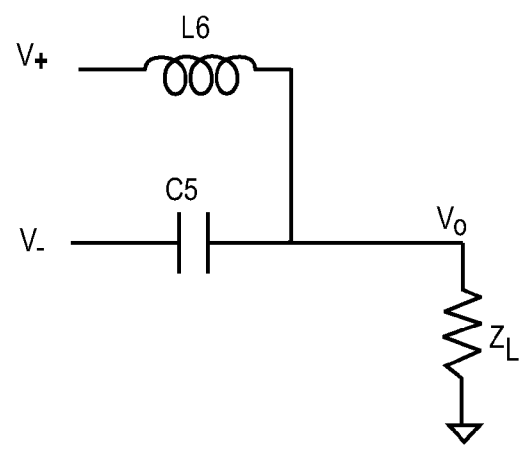
FIGS. 17 is a schematic diagram of a differential-to-single-ended conversion and impedance transformation circuit of the present invention.

The present invention provides a technique that performs differential-to-single ended conversion as well as impedance transformation and avoids the disadvantages of a transformer solution. FIG. 16 shows a block diagram of a differential-to-single-ended conversion and impedance transformation circuit. The circuit has a first impedance $X_1$ coupled between the second differential input signal $V_-$ and an output node $V_O$. A second impedance $X_2$ is coupled between the first differential input signal $V_+$ and the output node $V_O$. A load $Z_L$ is connected between the output node $V_O$ and ground. In the circuit shown in FIG. 16, current flowing to the output node $V_O$ from differential input $V_+$ is shifted in phase from the voltage on $V_+$. Similarly, current flowing to the output node $V_O$ from differential input $V_-$ is shifted in phase from the voltage on $V_-$. The impedances X1 and X2 are chosen so that these two currents add together when they are summed at the load $Z_L$. For example, if X1 shifts the output current by +90 degrees and X2 shifts the output current by −90 degrees then the resultant currents will sum in phase at the load. FIG. 17 illustrates one example of an implementation of the circuit shown in FIG. 16. FIG. 17 shows an L-C differential-to-single-ended conversion and impedance transformation circuit. The impedance X1 is comprised of a capacitor C5 which is coupled between the second differential input signal $V_-$ and the output node $V_O$. The impedance X2 is comprised of an inductor L6 which is coupled between the first differential input signal $V_+$ and the output node $V_O$.

Referring back to FIG. 16, since the inputs $V_+$ and $V_-$ are differential, the inputs have opposite signs. However, the differential inputs $V_+$ and $V_-$ are not necessarily equal in amplitude. The output voltage $V_O$ of the differential-to-single-ended conversion and impedance transformation circuit is given by the following equation:

$$V_O = \frac{(V_+ X_1 + V_- X_2)(-jX_2 X_1 + (X_1 + X_2)Z_L)}{((X_1 X_2)^2 + (X_1 + X_2)^2 Z_L^2)} Z_L. \quad (1)$$

The power $P_L$ delivered to the load $Z_L$ is given by the following equation:

$$P_L = \frac{(V_+ X_1 + V_- X_2)^2}{((X_1 X_2)^2 + (X_1 + X_2)^2 Z_L^2)} Z_L. \quad (2)$$

Differential-to-single-ended conversion is achieved if the impedances $X_1$ and $X_2$ have opposite signs. Impedances $X_1$ and $X_2$ may be comprised of any combination of reactive elements (e.g., capacitor C5 and inductor L6 shown in FIG. 17) whose combination meets this requirement. For example, if differential inputs $V_+$ and $V_-$ have equal amplitudes A, and impedances $X_1$ and $X_2$ have equal amplitudes X, then the output voltage $V_O$ can be determined by substituting these values into equation (1) above. The resulting output voltage $V_O$ is given by the following equation:

$$V_O = -j2A \frac{Z_L}{X}. \quad (3)$$

It can be seen from equation (3) that the ratio R/X can be chosen so that the amplitude of the output $V_O$ is either larger or smaller than the amplitude A of the differential input. The voltage of the output $V_O$ increases as the value of X decreases. Similarly, the voltage of the output $V_O$ decreases as the value of X increases.

Figure 18:
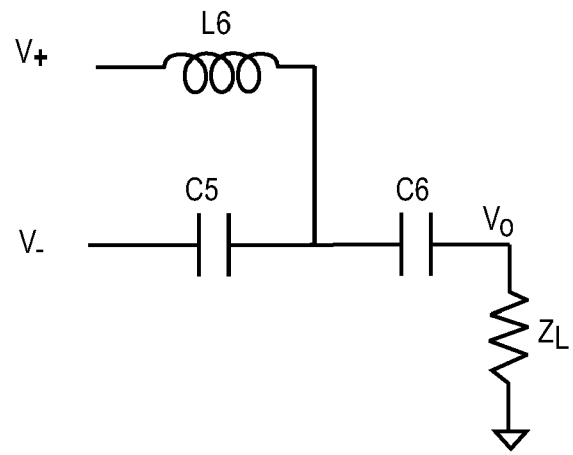
FIGS. 18 and 19 are schematic diagrams illustrating differential inputs AC-coupled from a load.
Figure 19:
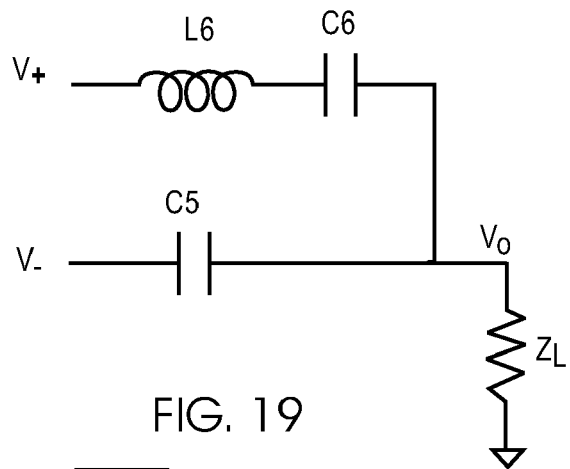

In certain applications, the load $Z_L$ must be AC-coupled from one of the differential inputs $V_-$ or $V_+$. FIGS. 18 and 19 show examples of a how the differential inputs may be AC-coupled from the load $Z_L$ in the example shown in FIG. 17. In the circuit shown in FIG. 18, an additional capacitor C6 is inserted between the output node $V_O$ and both the capacitor C5 and the inductor L6. The capacitor C6 AC-couples the output node $V_O$ from the first and second differential inputs $V_+$ and $V_-$. In the circuit shown in FIG. 19, an additional capacitor C6 is inserted between the output node $V_O$ and the inductor L6. The capacitor C6 AC-couples the output node $V_O$ from the first differential input $V_+$. Note that the capacitor C1 provides AC-coupling between the output node $V_O$ from the second differential input $V_-$.

Figure 20:
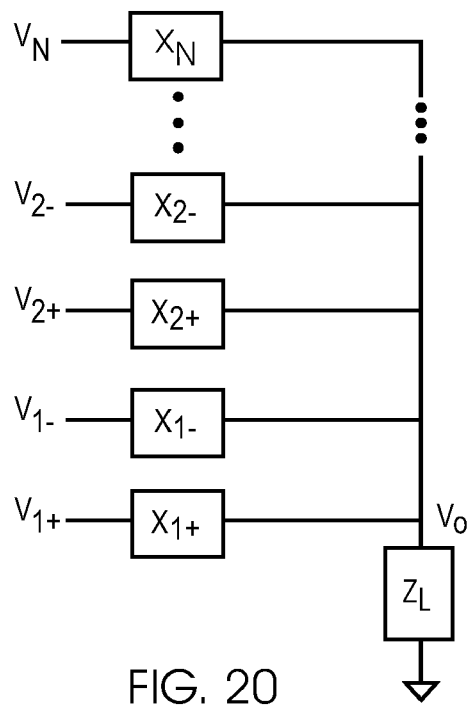
FIG. 20 is a block diagram of a differential-to-single-ended conversion and impedance transformation circuit having multiple differential inputs.

The techniques for providing differential-to-single-ended conversion and impedance transformation described above can be applied to circuits having multiple differential inputs. FIG. 20 shows a differential-to-single-ended conversion and impedance transformation circuit having multiple differential inputs. FIG. 20 shows differential inputs $V_1$ through $V_N$, where N is the total number of differential inputs. A first impedance $X_1$ is coupled between the differential input $V_1$ and the output node $V_O$. A second impedance $X_2$ is coupled between the differential input $V_1$ and the output node $V_O$. Similarly, an Nth impedance $X_N$ is coupled between the differential input $V_N$ and the output node $V_O$. Each of the currents from each differential input is summed in phase at the output node $V_O$. In this embodiment, the impedance $X_j$ between the jth differential input $V_j$ and the output node $V_O$ will depend on its phase with respect to that of other differential inputs. Optimal power transfer to the load $Z_1$ occurs when the impedances $X_j$ are purely reactive. However, this technique may still be applied when impedance $X_j$ is not purely reactive. For example, this might occur when actual inductors and capacitors have a series resistance.

As mentioned above, the RF power amplifier shown in FIG. 3 includes a voltage regulator 314 connected between the power amplifier 310 and a source of battery voltage VB to provide a voltage source VDD. In one embodiment of the present invention, the voltage regulator 314 resides on the same integrated circuit as the power amplifier circuit. The function of the voltage regulator is to provide a source of voltage to the power amplifier and to help control the output power level. For example, in a cellular phone environment, a base station may dictate the power level at which each cell phone should transmit (based on factors such as the physical distance from the base station, for example). Varying the voltage level (VDD) can control the output power of the power amplifier. As the voltage of the voltage source VDD increases, the output power increases. Therefore, by controlling the operation of the voltage regulator, and therefore controlling the voltage of voltage source VDD, the output power of the amplifier can be controlled. While the power amplifier 310 will function with any suitable voltage regulator or voltage source, described below is a detailed description of a suitable voltage regulator.

Figure 21:
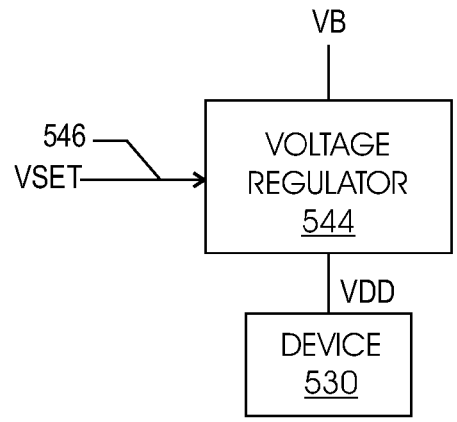
FIG. 21 is a block diagram of a voltage regulator of the present invention.

FIG. 21 is a block diagram of a voltage regulator 544 used to provide a regulated voltage VDD from a voltage source VB, for example, from a battery. As shown, the regulated voltage VDD is provided to a device 530. The device 530 may be any type of device requiring a voltage source including, but not limited to power amplifiers. The voltage regulator 544 includes an input 546 that is connected to a control signal VSET to control the voltage level VDD provided to the device 530. Following is a detailed description of the voltage regulator of the present invention in the context of its use in an RF power amplifier (such as that shown in FIG. 3). However, it is understood that the voltage regulator may be used with any type of amplifier as well as any other type of device requiring a voltage source.

Figure 22:
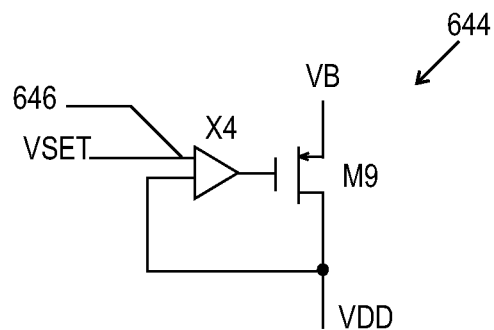
FIG. 22 is a schematic diagram of an embodiment of a voltage regulator of the present invention.

FIG. 22 is a schematic diagram of a first embodiment of a voltage regulator 644 connected to a battery voltage VB. The voltage regulator 644 is comprised of a device M9 and an op amp X4. The op amp X4 includes a first input 646 for connection to a voltage control signal VSET. In a preferred embodiment, the control signal VSET is an analog voltage signal that is proportional to the desired voltage level. The other input to the op amp X4 is connected to the regulated voltage VDD. The output of the op amp X4 is connected to the input of the device M9.

Figure 23:
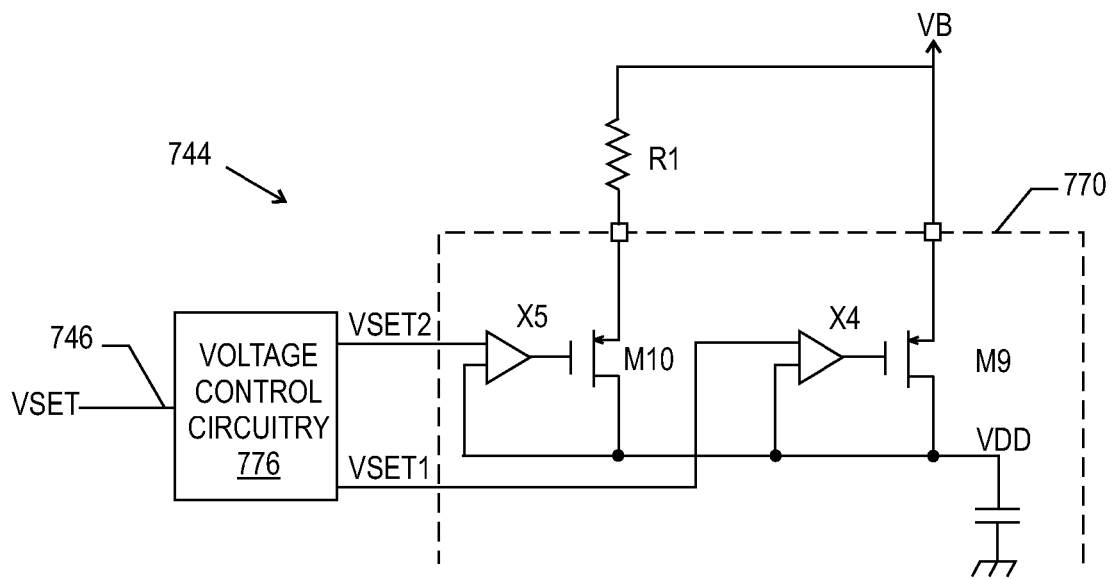
FIG. 23 is a schematic diagram of an embodiment of a voltage regulator of the present invention.

FIG. 23 is a schematic diagram of another embodiment of a voltage regulator 744 connected to a battery voltage VB. The voltage regulator 744 is similar to the voltage regulator 644 shown in FIG. 22 with the addition of a second regulator circuit comprised of op amp X5, switching device M10, and an external resistor R1. FIG. 23 also shows an integrated circuit 770 (dashed lines) to illustrate that the power amplifier is formed on the integrated circuit 770 while the resistor R1 is not. The integrated circuit 770 may also be the same integrated circuit on which the device to be powered resides.

The first regulator circuit is connected in the same manner as the regulator circuit shown in FIG. 22. The op amp X5 of the second regulator circuit includes an input VSET2 for connection to a voltage control signal. The other input to the op amp X5 is connected to the regulated voltage VDD. The output of the op amp X5 is connected to the gate of the device M10. The external resistor R1 is connected between the battery voltage VB and the device M10. FIG. 23 also shows voltage control circuitry 776 which has an input 746 connected to the control signal VSET. The voltage control circuitry 776 uses the signal VSET to create voltage control signals VSET1 and VSET2 for use by the first and second regulator circuits. By controlling both regulators, the voltage level VDD can be controlled. In addition, by selectively activating the second regulator, power can be dissipated off the integrated circuit 770 (via resistor R1). This results in a reduction of heat generated in the integrated circuit 770.

The voltage regulator 744 operates as follows. Since it is desired to minimize the amount of power dissipated on the integrated circuit 770, one goal is to maximize the use of the second regulator circuit (X5, M10) in order to maximize power dissipation through the external resistor R1. Therefore, voltage control circuitry 776 will enable the second regulator circuit to provide as much power as it can before enabling the first regulator circuit (X4, M9). In other words, when more power is required than the second regulator circuit can provide, the first regulator circuit is enabled to provide additional power. In this way, the maximum amount of power will be dissipated through external resistor R1.

Figure 24:
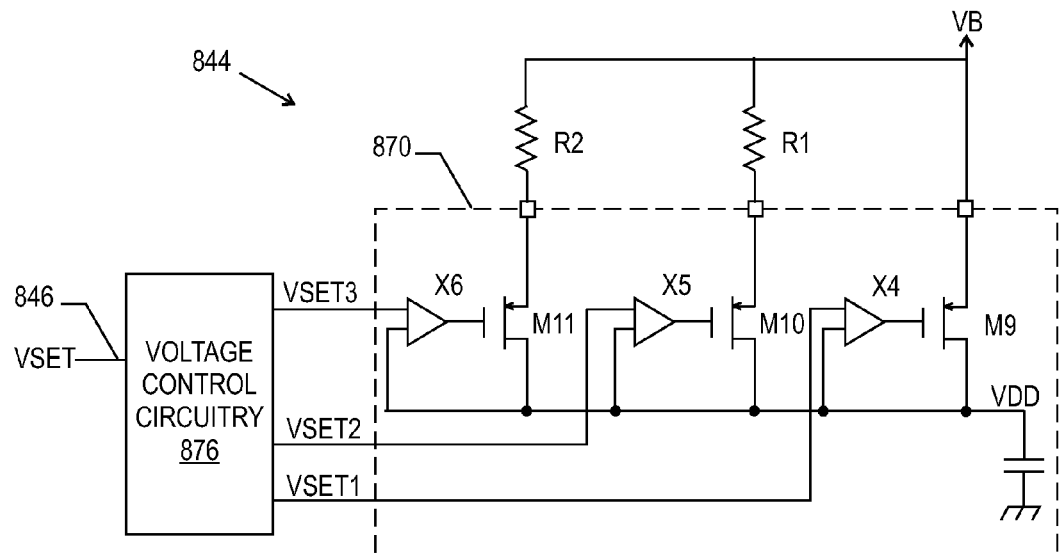
FIG. 24 is a schematic diagram of an embodiment of a voltage regulator of the present invention.

FIG. 24 is a schematic diagram of another embodiment of voltage regulator 844 having multiple regulators and multiple external resistors. The voltage regulator 844 is similar to the regulator 744 shown in FIG. 23, with the addition of a third regulator circuit comprised of device M11, op amp X6, and external resistor R2. The third regulator circuit is connected in the same ways as the second regulator circuit, and operates in a similar manner. The op amp X6 of the third regulator circuit includes an input VSET3 for connection to a voltage control signal. The other input to the op amp X5 is connected to the regulated voltage VDD. The output of the op amp X6 is connected to the gate of device M11. The external resistor R2 is connected between the batter voltage VB and device M11. FIG. 24 also shows voltage control circuitry 876 which has an input 846 connected to the control signal VSET. The voltage control circuitry 876 uses the signal VSET to create voltage control signals VSET1, VSET2, and VSET3 for use by the regulator circuits. By activating the second or third regulator, power can be dissipated off the integrated circuit 870 (via resistor R1 and/or R2). This results in a reduction of heat generated in the integrated circuit 870.

The voltage regulator 844 operates as follows. Since it is desired to minimize the amount of power dissipated on the integrated circuit 870, one goal is to maximize the use of the second and third regulator circuits in order to maximize power dissipation through the external resistors R1 and R2. Therefore, voltage control circuitry 876 will enable the second and third regulator circuits to provide as much power as it can before enabling the first regulator circuit. In other words, when more power is required than the second and/or third regulator circuit can provide, the first regulator circuit is enabled to provide additional power. In this way, the maximum amount of power will be dissipated through external resistors R1 and R2.

The values of the resistors R1 and R2 may be equal, or may be different, depending on the needs of a user. In addition, the invention is not limited to the use of one or two external resistors. Additional regulator circuits and external resistors could be added. In one embodiment, the value of resistor R1 is 0.7 ohms and the value of resistor R2 is 0.3 ohms.

Another benefit of the present invention involves the use of dual gate oxide devices. In CMOS digital systems, it is sometimes desired to provide devices suitable for use with two voltage levels (e.g., 3.3 volts and 5 volts). Therefore, processing technologies have been developed to provide a single integrated circuit having both 0.5 μm and 0.35 μm devices. As mentioned above, a thicker gate oxide results in a device with a higher breakdown voltage. On the other hand, a thinner gate oxide results in a faster device, but with a lower breakdown voltage.

The RF amplifier of the present invention takes advantage of the availability of dual gate oxide devices by selectively choosing certain gate lengths for various components of the amplifier. For example, it has been discovered that for pre-processing circuitry or pre-driver circuitry, a high speed is desirable and breakdown voltage is not as important. Therefore these devices are designed using a thinner gate oxide. For output state devices, where a high breakdown voltage is more important, the devices are designed using a thicker gate oxide.

In one embodiment, a dual gate oxide device is used to create an RF amplifier such as the RF amplifier shown in FIGS. 12, and 14. One suitable use of dual gate oxides in these amplifiers is to utilize devices having channel lengths of both 0.5 μm and 0.35 μm. The 0.5 μm and 0.35 μm devices have gate oxide thicknesses of 140 Angstroms (Å) and 70 Å, respectively. Referring to the example shown in FIG. 12, the predriver devices M5 and M6 can be chosen with much smaller device widths than the output devices M1 and M2. In this case, the predriver output signals Vip and Vin are nearly sinusoidal, the voltage difference (Vip−Vin) varies between about +Vdd and −Vdd, and the input capacitances of M1 and M2 can be chosen so that neither M5 nor M6 experiences a voltage drop that is larger than Vdd. As a result, a high breakdown voltage is not critical for the predriver and devices M5 and M6 can be implemented using 0.35 μm devices. When high efficiency is desired, switching devices M1 and M2 of the final amplifier stage are sized with large device widths so that nodes Vdn and Vdp are strongly clamped to their respective supply voltages of ground and Vdd when these devices are on. In this case, the voltage difference (Vdp-Vdn) varies over a range that is larger than that of the pre-driver and either M1, M2, or both will experience a voltage drop that is larger than Vdd. Since a higher breakdown voltage is desired from these devices, M1 and M2 can each be implemented using 0.5 μm devices. Since PMOS transistors are typically slower than NMOS transistors and thicker gate oxide devices are slower than thinner gate oxide devices, it is preferable to use a thicker gate oxide for NMOS devices than for PMOS devices. An example of the use of dual gate oxide thicknesses for the RF amplifier of FIG. 14 includes only NMOS devices with a thick gate oxide. Predriver transistors M5+, M5−, M6+, M6−, M7+, M8+, and M8− are implemented using using 0.35 μm devices because, as described above, they are not subjected to voltage drops greater than Vdd and breakdown is not a critical concern. As described above, the final amplifier stage experiences larger voltage swings. However these larger swings can be distributed across across its NMOS and PMOS devices in such a way that only NMOS devices see a voltage swing larger than Vdd. This is accomplished by adjusting the values of inductors L1+, L1−, and L4 and the input capacitances of devices M3+, M3−, M4+, and M4−. In this approach, PMOS devices M2+, M2−, M4+, and M4− in the final amplifier stage are thinner gate oxide devices, whereas NMOS devices M1+, M1−, M3+, M3− are thicker gate oxide devices.

Of course, the present invention is not limited to the values described above. For example, as thinner gate oxides become more common, one or both thicknesses may become lower. In addition, note that the terms "thicker" or "thinner" in this description are intended to only refer to intentional or significant differences in gate oxide thicknesses. For example, the 0.35 μm devices may vary from one another by some small amount depending on manufacturing tolerances. A 0.5 μm device is considered to be "thicker" than a 0.35 μm device. Also note that this invention applies to various CMOS devices and that the RF Amplifier described above is only used as one example of the application of dual gate oxide devices of the present invention.

Another benefit of the present invention relates to how an RF power amplifier of the present invention is packaged. The design of an RF amplifier requires a low inductance and low resistance to the transistors or switching devices. In addition, RF power amplifier designs typically require a number of passive components such as inductors and capacitors. It is advantageous to integrate these components in the power amplifier package. The packaging technique of the present invention addresses these concerns by using "flip chip" technology and multi-layer ceramic chip carrier technology.

Figure 25:
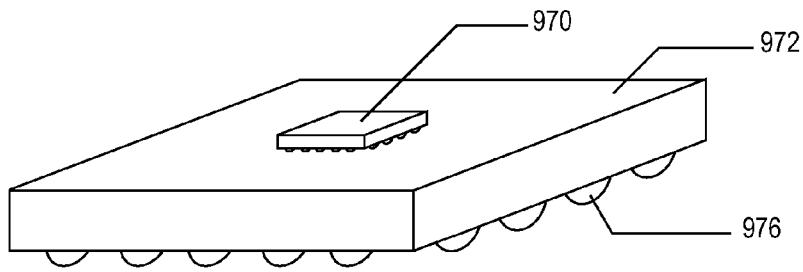
FIG. 25 is an isometric view illustrating how a device of the present invention is packaged.
Figure 26:
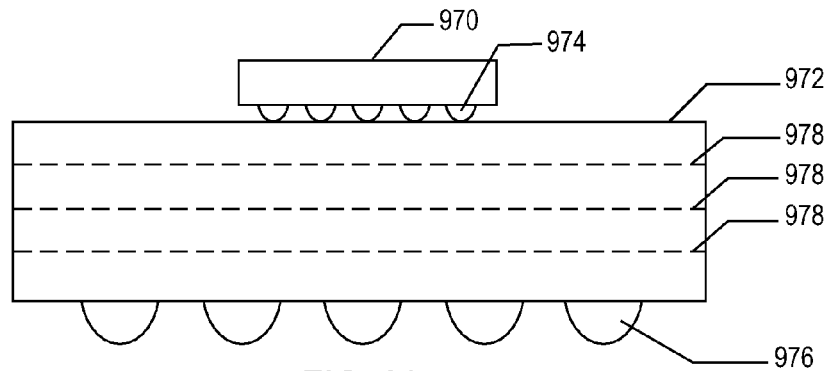
FIG. 26 is a side view of the device shown in FIG. 25.

FIGS. 25 and 26 are isometric and side views, respectively, illustrating a packaging technique of the present invention.

FIGS. 25 and 26 show a "flip chip" integrated circuit 970 mounted to a multi-layer ceramic chip carrier 972. The integrated circuit 970 includes a plurality of connection points, or "bumps" 974 on the underside of the integrated circuit 970. Similarly, the ceramic chip carrier 972 includes a plurality of connection points or bumps 976. The bumps 974 of the integrated circuit 970 are formed by solder and can be mounted to corresponding conductive material formed on the upper surface of the ceramic chip carrier 972. Similarly, the bumps 976 of the ceramic chip carrier 972 are also formed by solder and are used to mount the chip carrier 972 to a printed circuit board (not shown). A typical flip chip allows 250 µm spaced bumps. A typical chip carrier also allows 250 µm spaced vias for connection to the flip chip bumps 974. In one example, 6×6 mm ceramic chip carrier includes 36 bumps 976 for connection to a PCB. Flip chip and ceramic chip carrier technologies are considered conventional and will not be described in detail.

Various benefits can be realized by selectively placing certain components of the RF power amplifier of the present invention on integrated circuit 970 and ceramic chip carrier 972. The invention will be described with respect to the RF power amplifier shown in FIG. 14, although the invention is not limited to power amplifiers. In one embodiment of the invention, all of the switching devices are formed on the integrated circuit 970. In addition, the power transistors (such as switching devices M1+, M1−, M2+, M2−) formed on the integrated circuit 970 are preferably placed directly below the bumps 974 of the integrated circuit 970 resulting in low resistance and inductance (as compared to wire bond integrated circuit packages).

The multi-layer ceramic chip carrier 972 is used to build high-Q inductors, transformers, and capacitors. This can be beneficial for CMOS power amplifier architecture since multiple inductors and capacitors may be required. For example, a single band power amplifier may require 4-8 inductors which would be impractical to build on a printed circuit board. In addition, multiple matching networks are used to provide the high transformation ratio required in a push-pull amplifier design. In one embodiment of the invention, the transformers, inductors, capacitors, and other passive devices are formed on the ceramic chip carrier 972. The ceramic chip carrier 972 includes multiple conductive layers 978 (shown as hidden lines) that can be designed to implement these passive devices.

In one embodiment of the RF power amplifier shown in FIG. 14, all of the switching devices and capacitors C2+ and C2 reside on the integrated circuit 970, with the inductors L3+, L3−, L5, L1+, L1−, L4, L2+, and L2− residing on the multi-layer ceramic chip carrier 972.

Figure 27:
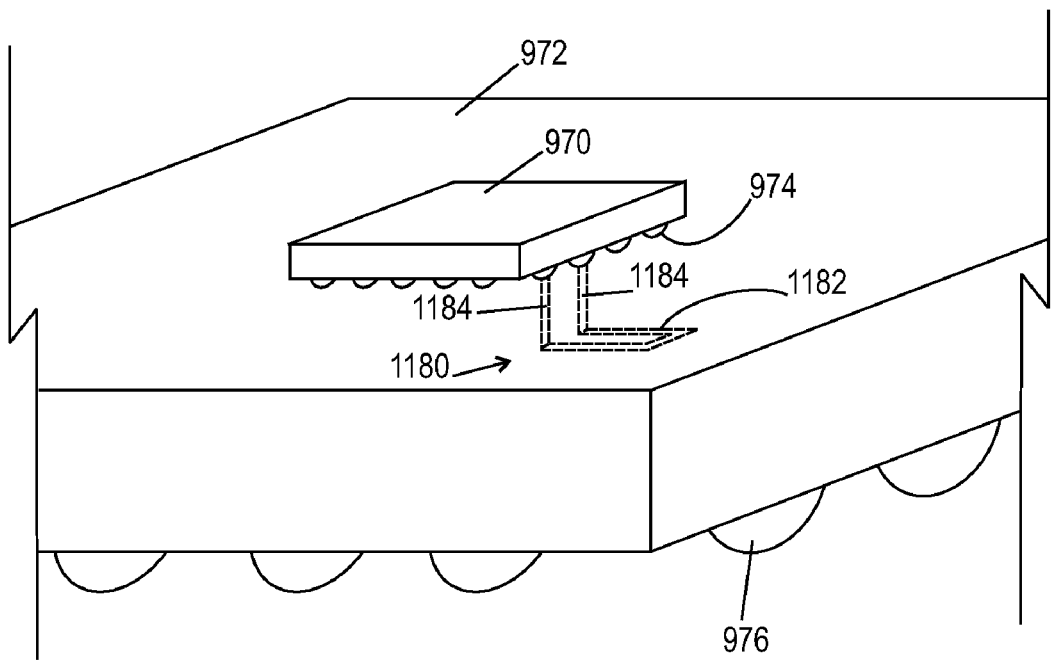
FIG. 27 is a diagram illustrating a ceramic chip carrier with an inductor formed in the carrier.

In a CMOS power amplifier design, multiple high-Q inductors are required to tune out large on-chip gate capacitances. Since these capacitances are large, the required inductors are low in value and difficult to integrate. One solution is to form high-Q inductors on the ceramic chip carrier. FIG. 27 is a diagram illustrating the ceramic chip carrier 972 shown in FIGS. 25 and 26 with a horizontally-formed inductor 1180 formed in the ceramic chip carrier 972. The inductor 1180 includes a horizontal loop portion formed by conductive trace 1182 connected to two bumps 974 of the ceramic chip carrier 972 by two vias 1184. One disadvantage with the inductor 1180 is that the inductor connection points needs to be close to the edge of the ceramic chip carrier 972 unless the value of the inductor is large enough to route to a lower layer of the ceramic chip carrier 972.

Figure 28:
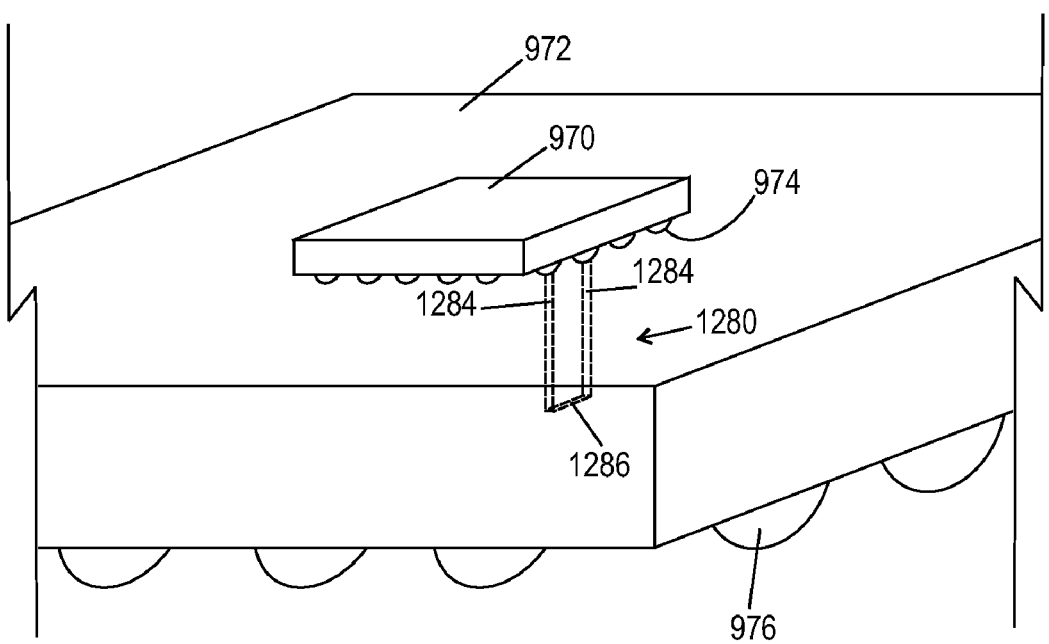
FIG. 28 is a diagram illustrating a ceramic chip carrier with a vertically-formed inductor formed in the carrier.

FIG. 28 is a diagram illustrating the ceramic chip carrier 972 with a vertically-formed inductor 1280 formed in the carrier 972. The inductor 1280 is formed in the vertical direction by vias 1284 extending to conductive trace 1286, which may be formed on a lower level of the carrier 972. As shown, the inductor 1280 extends downward into the ceramic chip carrier 972 and is coplanar, since the vias 1284 and trace 1286 exist on the same plane. The vias 1284 may be formed through several layers of the carrier 972, depending the inductance desired. A vertically-formed inductor such as the inductor 1280 has two major advantages over horizontally-formed inductors. First, the vertically-formed inductors can be formed underneath the chip 970 without blocking other routing channels. Therefore, more layout options are available, and more inductors can be formed. Second, the vertically-formed vias 1284, as opposed to the horizontal conductive trace 1182, result in less loss at RF frequencies since the vias 1284 have a greater cross-sectional surface area than the conductive traces. The vias 1284 are substantially cylindrical and have a surface area of $\pi dL$, where d is the diameter of the via 1284 (e.g., 100 µm) and L is the length of the via. The conductive traces, such as conductive trace 1182, have a surface area of 2 dL. Therefore, the resistance of a via at RF frequencies is approximately $\pi/2$ less than the resistance of a conductive trace 1182.

Figure 29:
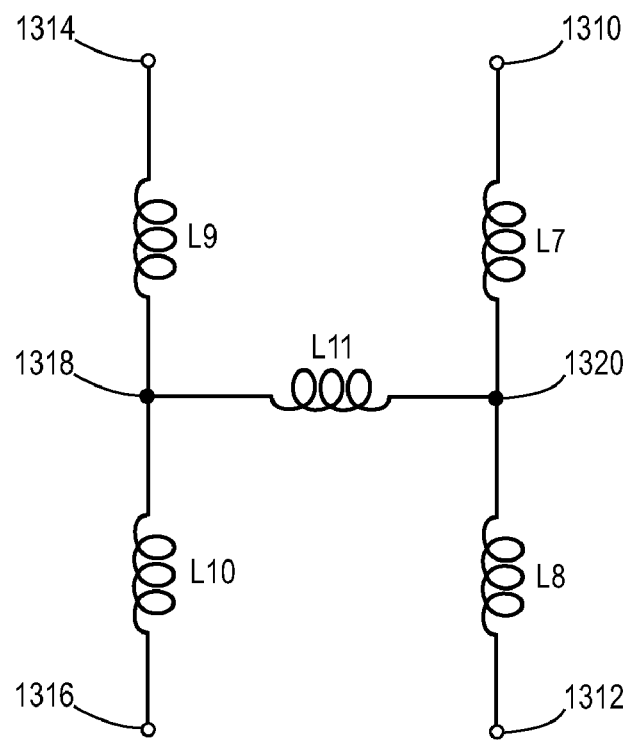
FIG. 29 is an electrical schematic diagram of inductors connected between four connection points.
Figure 30:
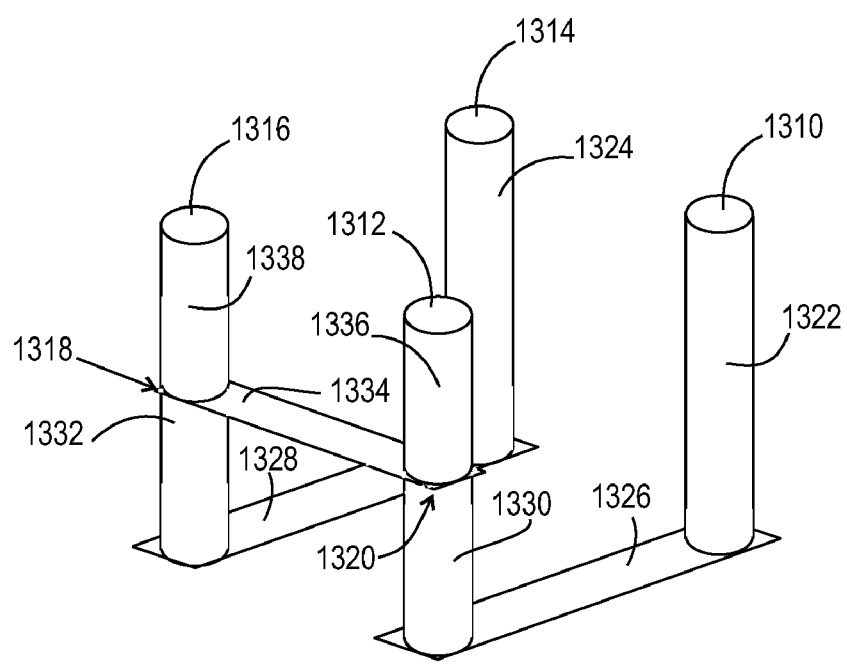
FIG. 30 is a diagram illustrating an example of how the inductors shown in FIG. 29 could be formed in a ceramic chip carrier.

FIGS. 29 and 30 illustrate one embodiment of vertically-formed inductors of the present invention. FIG. 29 is an electrical schematic diagram showing inductors L7, L8, L9, L10, and L11 connected between connection points 1310, 1312, 1314, and 1316. As shown, inductors L7 and L8 are connected between connection points 1310 and 1312. Similarly, inductors L9 and L10 are connected between connection points 1314 and 1316. Inductor L11 is connected between connection points 1318 and 1320, which are formed between inductors L9 and L10, and L7 and L8.

FIG. 30 illustrates an example of how the circuit of FIG. 29 can be implemented using vertically-formed inductors of the present invention. The connection points 1310, 1312, 1314, and 1316 are formed at the surface of the ceramic chip carrier (not shown in FIG. 30) and will be electrically connected to four of the bumps 974 of the flip-chip 970. In this example, the inductors are formed using the upper two layers of the ceramic chip carrier. Vias 1322 and 1324 extend through both layers where they are connected to an end of conductive traces 1326 and 1328, respectively, formed in the lower layer of the ceramic chip carrier. The opposite ends of the conductive traces 1326 and 1328 are connected to vias 1330 and 1332, respectively, which are also formed in the lower layer of the ceramic chip carrier. Together, the via 1322, conductive trace 1326, and via 1330 form inductor L7. Similarly, the via 1324, conductive trace 1328, and via 1332 form inductor L9. The vias 1330 and 1332 are connected to opposite ends of conductive trace 1334, formed in the upper layer. The conductive trace 1334 forms the inductor L11. Finally, vias 1336 and 1338 are connected to the vias 1330 and 1332, respectively, as well as to opposite ends of the conductive trace 1334. The vias 1336 and 1338 form the inductors L8 and L10, respectively. While FIGS. 29 and 30 show one specific example of how inductors could be formed in the ceramic chip carrier, it should be understood that other implementations are possible.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A differential RF power amplifier comprising:
a first amplifier;
a second amplifier, wherein the first and second amplifiers are configured to be coupled differentially to a load;
one or more tank circuits coupled to the first and second amplifiers; and
first and second cross-coupled switching devices coupled to the first and second amplifiers, wherein the first and second cross-coupled switching devices are configured to provide attenuation to signals in a common-mode path while providing less attenuation to signals in a differential-mode path.

2. A method of stabilizing a differential RF power amplifier comprising:
providing a first amplifier;
providing a second amplifier;
coupling the first and second amplifiers differentially to a load;
providing a plurality of circuit elements coupled to the first and second amplifiers, wherein the plurality of circuit elements form one or more tank circuits; and
coupling first and second cross-coupled switching devices to the first and second amplifiers, wherein the first and second cross-coupled switching devices are configured to provide attenuation to signals in a common-mode path while providing less attenuation to signals in a differential-mode path.

3. The differential RF power amplifier of claim 1, wherein the first and second switching devices are coupled to inputs of the first and second amplifiers.

4. The differential RF power amplifier of claim 1, wherein the first and second switching devices are coupled to outputs of the first and second amplifiers.

5. The differential RF power amplifier of claim 1, wherein the first and second switching devices are sized to optimize the attenuation of signals in the common-mode path and differential-mode path.

6. The differential RF power amplifier of claim 1, wherein the drain of the first switching device and the gate of the second switching device are coupled to the first amplifier and the drain of the second switching device and the gate of the first switching device are coupled to the second amplifier.

7. The differential RF power amplifier of claim 1, wherein:
the first amplifier is comprised of third and fourth switching devices coupled between a voltage differential, and a first inductance coupled between the third and fourth switching devices; and
the second amplifier is comprised of fifth and sixth switching devices coupled between a voltage differential, and a second inductance coupled between the fifth and sixth switching devices.

8. The differential RF power amplifier of claim 1, wherein the first and second amplifiers are implemented using a complementary metal oxide semiconductor (CMOS).

9. The differential RF power amplifier of claim 1, wherein the differential RF power amplifier is suitable for use in a cellular telephone.

10. The method of claim 2, wherein the first and second switching devices are coupled to inputs of the first and second amplifiers.

11. The method of claim 2, wherein the first and second switching devices are coupled to outputs of the first and second amplifiers.

12. The method of claim 2, wherein the first and second switching devices are sized to optimize the attenuation of signals in the common-mode path and differential-mode path.

13. The method of claim 2, wherein the drain of the first switching device and the gate of the second switching device are coupled to the first amplifier and the drain of the second switching device and the gate of the first switching device are coupled to the second amplifier.

14. The method of claim 2, the method further comprising:
coupling a drain of the first switching device and a gate of the second switching device to the first amplifier; and
coupling a drain of the second switching device and a gate of the first switching device to the second amplifier.

15. The method of claim 14, further comprising coupling a resistor between the gates of the first and second switching devices.

16. The method of claim 2, further comprising:
providing the first amplifier by coupling third and fourth switching devices between a voltage differential, and coupling a first inductance between the third and fourth switching devices; and
providing the second amplifier by coupling fifth and sixth switching devices between a voltage differential, and coupling a second inductance between the fifth and sixth switching devices.

17. The method of claim 2, wherein the first and second amplifiers are implemented using a complementary metal oxide semiconductor (CMOS).

18. The method of claim 2, wherein the differential RF power amplifier is suitable for use in a cellular telephone.

19. The differential RF power amplifier of claim 1, wherein the common-mode path is formed when one or more of the tank circuits resonates.

20. The method of claim 2, wherein the common-mode path is formed when one or more of the tank circuits resonates.

* * * * *